(12) United States Patent
Lee et al.

(10) Patent No.: US 12,713,582 B2
(45) Date of Patent: Aug. 18, 2026

(54) SEMICONDUCTOR ELEMENT, ELECTRONIC SYSTEM INCLUDING THE SEMICONDUCTOR ELEMENT, AND METHOD OF FABRICATING THE SEMICONDUCTOR ELEMENT

(71) Applicant: Samsung Electronics Co., Ltd., Suwon-si (KR)

(72) Inventors: Eunkyu Lee, Yongin-si (KR); Sangwon Kim, Seoul (KR); Kyung-Eun Byun, Seongnam-si (KR); Yeonchoo Cho, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 775 days.

(21) Appl. No.: 17/939,303

(22) Filed: Sep. 7, 2022

(65) Prior Publication Data

US 2023/0072863 A1 Mar. 9, 2023

(30) Foreign Application Priority Data

Sep. 8, 2021 (KR) ........................ 10-2021-0119932

(51) Int. Cl.
*H10B 12/00* (2023.01)

(52) U.S. Cl.
CPC ........... *H10B 12/34* (2023.02); *H10B 12/053* (2023.02)

(58) Field of Classification Search
CPC .... H10D 64/01; H10D 64/027; H10D 64/117; H10D 64/512; H10D 64/513;

(Continued)

(56) References Cited

U.S. PATENT DOCUMENTS 11,626,409 B2 4/2023 Kim et al.
2010/0102292 A1 4/2010 Hiura et al.

(Continued)

FOREIGN PATENT DOCUMENTS

DE 10-2021-113443 A1 3/2022
JP 2020/532878 A 11/2020

(Continued)

OTHER PUBLICATIONS

Korean Office Action dated Aug. 18, 2025 for corresponding Korean Patent Application No. 10-2021-0119932 and its English-language translation.

(Continued)

*Primary Examiner* — Nelson Garces
(74) *Attorney, Agent, or Firm* — Harness, Dickey & Pierce, P.L.C.

(57) ABSTRACT

A semiconductor element may include a substrate including source and drain regions formed in the substrate apart from each other by a trench, a gate insulating layer covering a bottom surface and a sidewall of the trench, a gate electrode including lower and upper buried portions. The lower buried portion may be in the trench with the gate insulating layer therearound and fill a lower region of the trench. The upper buried portion may be on the lower buried portion with the gate insulating layer therearound and fill an upper region of the trench. The upper buried portion may include a two-dimensional material layer in the trench on an upper surface of the first conductive layer and an upper region of the sidewall of the gate insulating layer, and a second conductive layer in the upper region of the trench and surrounded by the two-dimensional material layer.

19 Claims, 26 Drawing Sheets

(58) Field of Classification Search
CPC .. H10D 64/516; H10D 64/666; H10D 64/667; H10D 64/671; H10D 30/60; H10D 62/126; H10D 62/151; H10B 10/12; H10B 12/05; H10B 12/053; H10B 12/34
See application file for complete search history.

(56) References Cited

U.S. PATENT DOCUMENTS

2016/0172488 A1* 6/2016 Oh .................... H10D 64/513 257/330
2016/0315088 A1* 10/2016 Kang ............... H10D 30/0275
2017/0047421 A1 2/2017 Oh et al.
2020/0105765 A1 4/2020 Kim et al.
2020/0235055 A1 7/2020 Hegde et al.
2020/0321443 A1 10/2020 Teo et al.
2021/0305161 A1* 9/2021 Chandrasekhar ........................ H01L 23/53266
2022/0077154 A1 3/2022 Kim et al.

FOREIGN PATENT DOCUMENTS

KR 10-2016-0073143 A 6/2016
KR 10-2020-0007246 A 1/2020
KR 10-2020-0038386 A 4/2020
KR 10-2020-0090088 A 7/2020
KR 102250583 B1 5/2021
KR 10-2022-0033587 A 3/2022
WO 2008/108383 A1 9/2008
WO 2020/180680 A1 9/2020

OTHER PUBLICATIONS

Chuhei Oshima et al., "Ultra-thin epitaxial films of graphite and hexagonal boron nitride on solid surfaces" J. Phys. Condens. Matter 9, 1 (1997); DOI 10.1088/0953-8984/9/1/004.
Seung Min Song et al., Determination of Work Function of Graphene under a Metal Electrode and Its Role in Contact Resistance, Nano Letters 2012 12 (8), 3887-3892; DOI: 10.1021/nl300266p.
Min-Hyun Lee et al., Two-Dimensional Materials Inserted at the Metal/Semiconductor Interface: Attractive Candidates for Semiconductor Device Contacts, Nano Letters 2018 18 (8), 4878-4884; DOI: 10.1021/acs.nanolett.8b01509.
G. Giovannetti et al., "Doping Graphene with Metal Contacts", Phys. Rev. Lett. 101, 026803, Published Jul. 10, 2008; DOI: https://doi.org/10.1103/PhysRevLett. 101.026803.
Wayne K. Morrow et al., , Review of Graphene as a Solid State Diffusion Barrier. Small, 12: 120-134. (2016); https://doi.org/10.1002/smll.201501120.
Md. Saiful Islam et al., "Design and modelling of a double gate bilayer graphene field effect transistor," Asia-Pacific Microwave Conference 2011, Melbourne, VIC, Australia, 2011, pp. 343-346.

* cited by examiner

SEMICONDUCTOR ELEMENT, ELECTRONIC SYSTEM INCLUDING THE SEMICONDUCTOR ELEMENT, AND METHOD OF FABRICATING THE SEMICONDUCTOR ELEMENT

CROSS-REFERENCE TO RELATED APPLICATION

This application is based on and claims priority under 35 U.S.C. § 119 to Korean Patent Application No. 10-2021-0119932, filed on Sep. 8, 2021, in the Korean Intellectual Property Office, the disclosure of which is incorporated by reference herein in its entirety.

BACKGROUND

1. Field

The present disclosure relates to a semiconductor element, an electronic system including the semiconductor element, and/or a method of fabricating the semiconductor element, and more particularly, to a semiconductor element including a two-dimensional material layer to reduce gate induced drain leakage (GIDL), an electronic system including the semiconductor element, and/or a method of fabricating the semiconductor element.

2. Description of the Related Art

Transistors are semiconductor elements having an electrical switching function and are widely used in various integrated circuit (IC) devices such as memories, driving IC, logic devices. Spaces for transistors in IC devices have significantly been reduced to increase the degree of integration of the IC devices, and thus research has been conducted to reduce the size of transistors while maintaining their performance.

Recently, research has been conducted into a buried channel array transistor (BCAT) structure capable of guaranteeing a sufficiently large effective channel length even though the BCAT structure occupies a small area. In the BCAT structure, a gate electrode is filled in a trench formed between a source region and a drain region of a substrate. A channel is formed under the gate electrode buried in the trench by an electrical potential formed between the source region and the drain region. As described above, the gate electrode is buried in the trench formed between the source region and the drain region, and thus a portion of the gate electrode overlaps the source region and the drain region.

In this case, because a gate insulating layer provided between the gate electrode and the source and drain regions has a small thickness for a high degree of integration of an IC device, the performance of a semiconductor device may decrease due to gate induced drain leakage (GIDL), that is, due to charge leakage of a capacitor connected to the drain region.

In Patent Document No. KR 10-2250583 B1, an n-type polysilicon layer having a low work function is formed in an upper region of a gate electrode adjacent to source and drain regions to reduce GIDL in a semiconductor element. Although n-type polysilicon has a low work function, n-type polysilicon has electrical conductivity less than that of metals, and thus the performance of the gate electrode may be poor.

SUMMARY

Provided are semiconductor elements having a structure in which a two-dimensional material layer is provided in an upper region of a gate electrode adjacent to source and drain regions, electronic systems including the semiconductor elements, and methods of fabricating the semiconductor elements.

Additional aspects will be set forth in part in the description which follows and, in part, will be apparent from the description, or may be learned by practice of the presented embodiments of the disclosure.

According to an embodiment, a semiconductor element may include a substrate including a trench, a source region, and a drain region; a gate insulating layer covering a bottom surface and a sidewall of the trench; a gate electrode including a lower buried portion and an upper buried portion with the gate insulating layer therearound; and a capping layer on the gate electrode. The source region and the drain region may be separated apart from each other by the trench. The lower buried portion may fill a lower region of the trench. The upper buried portion may be on the lower buried portion and may fill an upper region of the trench.

In some embodiments, the lower buried portion may include a barrier layer and a first conductive layer. The barrier layer may be in the trench. The barrier layer may cover a bottom surface of the gate insulating layer and a lower region of a sidewall of the gate insulating layer. The barrier layer may surround the first conductive layer. The first conductive layer may fill the lower region of the trench. The lower buried portion may not overlap the source region and the drain region.

In some embodiments, the upper buried portion may include a two-dimensional material layer and a second conductive layer. The two-dimensional material layer may be in the trench. The two-dimensional material layer may cover an upper surface of the first conductive layer and an upper region of the sidewall of the gate insulating layer. The two-dimensional material layer may surround the second conductive layer. The second conductive layer may fill the upper region of the trench. The upper buried portion may overlap the source region and the drain region.

In some embodiments, a work function of the second conductive layer may be less than a work function of the first conductive layer.

In some embodiments, a work function of the second conductive layer may be about 2 eV to about 5 eV.

In some embodiments, the second conductive layer may include at least one of aluminum (Al), titanium (Ti), chromium (Cr), gold (Au), nickel (Ni), and platinum (Pt).

In some embodiments, the two-dimensional material layer may include at least one of graphene, black phosphorus, amorphous boron nitride, two-dimensional hexagonal boron nitride (h-BN), phosphorene, and a transition metal dichalcogenide.

In some embodiments, the transition metal dichalcogenide may include a metal and a chalcogen. The metal may include one of molybdenum (Mo), tungsten (W), niobium (Nb), vanadium (V), tantalum (Ta), titanium (Ti), zirconium (Zr), hafnium (Hf), technetium (Tc), rhenium (Re)), copper (Cu), gallium (Ga), indium (In), tin (Sn), germanium (Ge), and lead (Pb). The chalcogen may include one of sulfur (S), selenium (Se), and tellurium (Te).

In some embodiments, a first thickness of a lower region of the gate insulating layer may be less than a second thickness of an upper region of the gate insulating layer. The lower region of the gate insulating layer may surround the barrier layer, and the upper region of the gate insulating layer may surround the two-dimensional material layer.

In some embodiments, a first dielectric constant of a lower region of the gate insulating layer may be greater than a second dielectric constant of an upper region of the gate insulating layer. The lower region of the gate insulating layer may surround the barrier layer, and the upper region of the gate insulating layer may surround the two-dimensional material layer.

In some embodiments, a material in the first conductive layer may be different from a material in the second conductive layer.

In some embodiments, the first conductive layer may include tungsten (W).

In some embodiments, the barrier layer may include titanium nitride.

According to an example embodiment, a semiconductor element may include a substrate comprising a trench, a source region, and a drain region; a gate insulating layer covering a bottom surface and a sidewall of the trench; a gate electrode including a barrier layer, a two-dimensional material layer, and a conductive layer; and a capping layer on the gate electrode. The gate insulating layer may surround the barrier layer. The barrier layer may be in the trench. The barrier layer may cover a bottom surface of the gate insulating layer and a lower region of a sidewall of the gate insulating layer. The two-dimensional material layer may cover an upper region of the sidewall of the gate insulating layer in the trench. The conductive layer may be in the trench and surrounded by the barrier layer and the two-dimensional material layer. The source region and the drain region may be separated apart from each other by the trench. The barrier layer may not overlap the source region and the drain region. The two-dimensional material layer may overlap the source region and the drain region.

In some embodiments, the conductive layer may include at least one of aluminum (Al), titanium (Ti), chromium (Cr), gold (Au), nickel (Ni), and platinum (Pt).

In some embodiments, the two-dimensional material layer may include at least one of graphene, black phosphorus, amorphous boron nitride, two-dimensional hexagonal boron nitride (h-BN), phosphorene, and a transition metal dichalcogenide.

In some embodiments, the transition metal dichalcogenide may include a metal and a chalcogen. The metal may include one of molybdenum (Mo), tungsten (W), niobium (Nb), vanadium (V), tantalum (Ta), titanium (Ti), zirconium (Zr), hafnium (Hf), technetium (Tc), rhenium (Re)), copper (Cu), gallium (Ga), indium (In), tin (Sn), germanium (Ge), and lead (Pb). The chalcogen may include one of sulfur (S), selenium (Se), and tellurium (Te).

According to an embodiment, a method of fabricating a semiconductor element may include forming a trench in a substrate; forming a gate insulating layer to cover a bottom surface and a sidewall of the trench; forming a gate electrode on the gate insulating layer in the trench; forming a capping layer on the gate electrode; and forming a source region and a drain region in the substrate respectively on both sides of the gate electrode.

In some embodiments, the forming the gate electrode may include forming a barrier layer in the trench, forming a two-dimensional material layer in the trench, and forming a conductive layer in the trench. The barrier layer may cover a bottom surface of the gate insulating layer and a lower region of a sidewall of the gate insulating layer. The two-dimensional material layer may cover an upper region of the sidewall of the gate insulating layer. The conductive layer may be surrounded by the barrier layer and the two-dimensional material layer.

In some embodiments, an upper region of the conductive layer may be surrounded by the two-dimensional material layer. A lower region of the conductive layer may be surrounded by the barrier layer. A work function of the upper region of the conductive layer may be less than a work function of the lower region of the conductive layer.

In some embodiments, the forming the two-dimensional material layer may include chemical vapor deposition (CVD).

In some embodiments, the forming the two-dimensional material layer may include supplying hydrogen radicals.

In some embodiments, the forming the two-dimensional material layer may include supplying oxygen radicals.

In some embodiments, the method may further include forming a second conductive layer in an upper region of the trench and surrounded by the two-dimensional material layer. The forming the conductive layer may include forming a first conductive layer in a lower region of the trench and surrounded by the barrier layer. The forming the first conductive layer may be performed after the forming the barrier layer and before the forming the two-dimensional material layer. The forming the second conductive layer may be performed after the forming the two-dimensional material layer. The forming the two-dimensional material layer may be performed such that the two-dimensional material layer covers an upper surface of the first conductive layer and the upper region of the sidewall of the gate insulating layer in the trench.

In some embodiments, the second conductive layer may include at least one of aluminum (Al), titanium (Ti), chromium (Cr), gold (Au), nickel (Ni), and platinum (Pt).

In some embodiments, the two-dimensional material layer may include at least one of graphene, black phosphorus, amorphous boron nitride, two-dimensional hexagonal boron nitride (h-BN), phosphorene, and a transition metal dichalcogenide.

According to an embodiment, a semiconductor element may include a substrate including a source region, a drain region, and a trench in the substrate between the source region and drain region; a gate insulating layer covering a bottom surface and a sidewall of the trench; a gate electrode comprising an upper buried portion on a lower buried portion in the trench and surrounded by the gate insulating layer; and a capping layer on the gate electrode. The lower buried portion may include a first conductive portion on a barrier layer surrounding the first conductive portion. The upper buried portion may be between the source region and the drain region such that the lower buried portion does not extend between the source region and the drain region. The upper buried portion may include a second conductive portion and a two-dimensional material layer surrounding the second conductive portion. A work function of the second conductive portion may be less than a work function of the first conductive portion.

In some embodiments, the capping layer may be in the trench, and two-dimensional material layer may surround the capping layer.

In some embodiments, the first conductive portion may be a first conductive layer including tungsten (W) The second conductive portion may be a second conductive layer comprising at least one of aluminum (Al), titanium (Ti), chromium (Cr), gold (Au), nickel (Ni), and platinum (Pt).

In some embodiments, the two-dimensional material layer may include at least one of graphene, black phosphorus, amorphous boron nitride, two-dimensional hexagonal boron nitride (h-BN), phosphorene, and a transition metal dichalcogenide.

In some embodiments, a first thickness of a lower region of the gate insulating layer may be less than a second thickness of an upper region of the gate insulating layer. The lower region of the gate insulating layer may surround the barrier layer. The upper region of the gate insulating layer may surround the two-dimensional material layer.

According to an embodiment, an electronic system may include a controller and a memory configured to store instructions executed by the controller; and an input/output device coupled to the controller. The memory may include the semiconductor element according to the embodiment.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
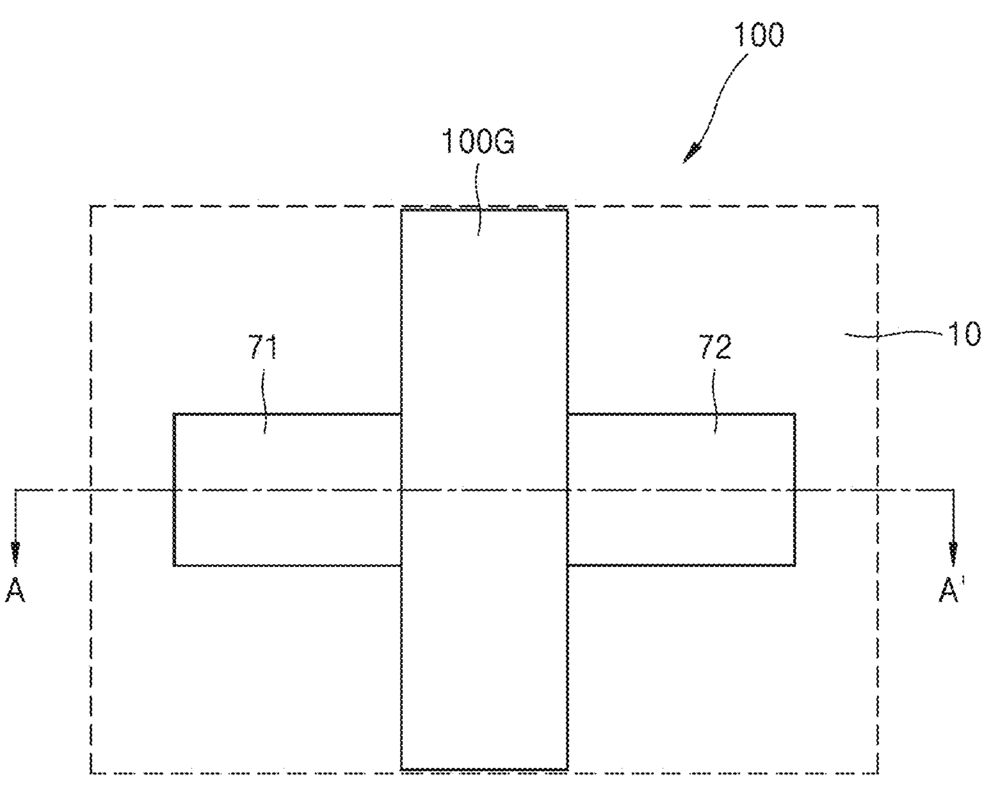
FIG. 1 is a plan view illustrating an example structure of a semiconductor element according to an embodiment.
Figure 1:
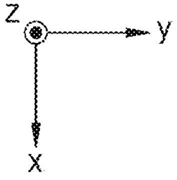

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list. For example, "at least one of A, B, and C," and similar language (e.g., "at least one selected from the group consisting of A, B, and C") may be construed as A only, B only, C only, or any combination of two or more of A, B, and C, such as, for instance, ABC, AB, BC, and AC.

When the terms "about" or "substantially" are used in this specification in connection with a numerical value, it is intended that the associated numerical value includes a manufacturing or operational tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes.

In the drawings, the sizes of elements may be exaggerated for clarity of illustration.

It will be understood that although terms such as "first" and "second" are used herein to describe various elements, these elements should not be limited by these terms. These terms are only used to distinguish one element from other elements.

In the following description, when an element is referred to as being "above" or "on" another element, it may be directly above or on the other element while making contact with the other element or it may be above or on the other element without making contact with the other element. For example, the element may be above or on one or more intervening elements between the element and the other element. The terms of a singular form may include plural forms unless otherwise mentioned.

It will be further understood that the terms "comprises" and/or "comprising" used herein specify the presence of stated features or elements, but do not preclude the presence or addition of one or more other features or elements.

An element referred to with the definite article or a demonstrative pronoun may be construed as the element or the elements even though it has a singular form. Examples are just used herein to describe technical ideas and should not be considered for purposes of limitation unless defined by the claims.

Operations of a method may be performed in an appropriate order unless explicitly described in terms of order or described to the contrary. In addition, examples or example terms (for example, "such as" and "etc.") are used for the purpose of description and are not intended to limit the scope of the present disclosure unless defined by the claims.

Figure 2:
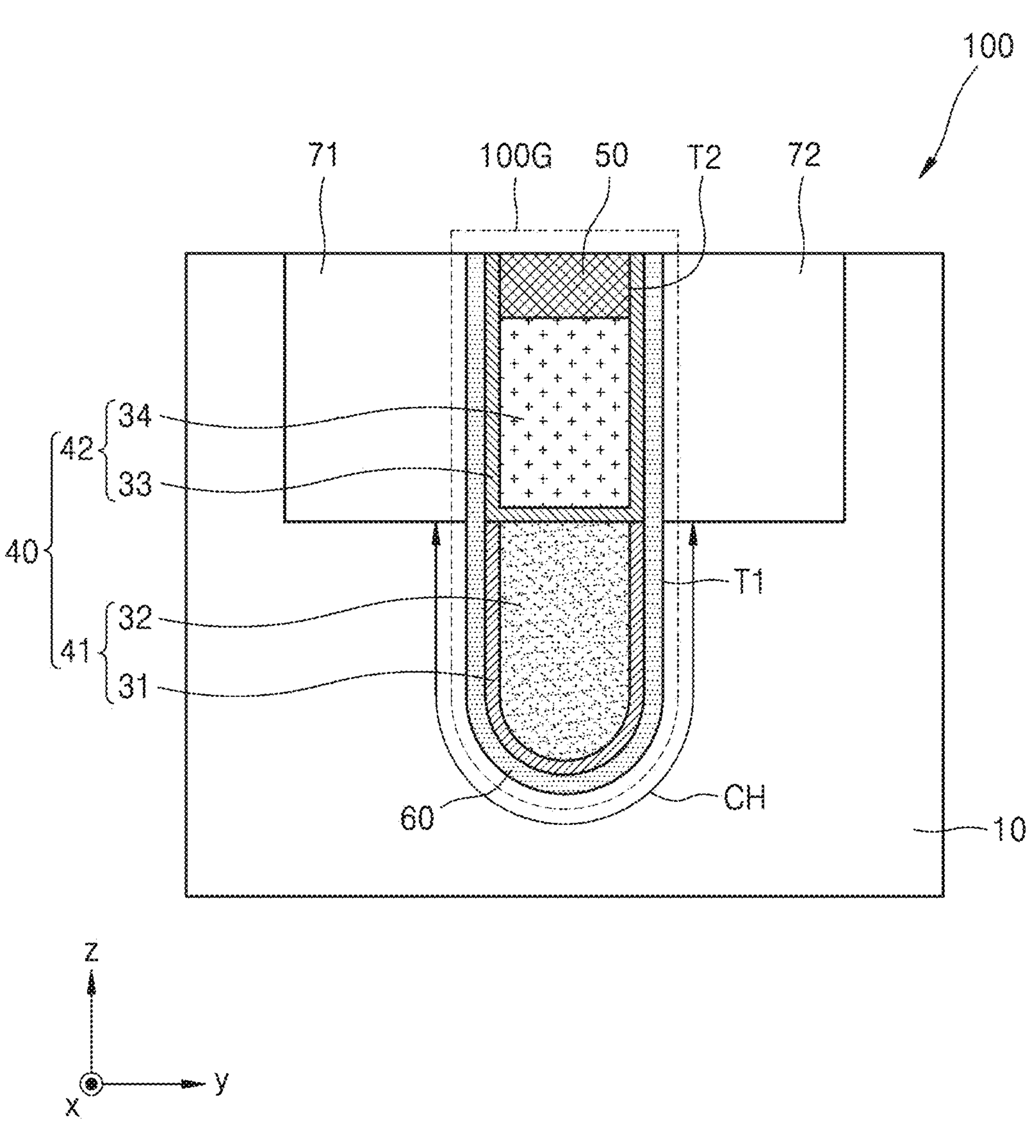
FIG. 2 is a cross-sectional view taken along line A-A' of FIG. 1.
Figure 3:
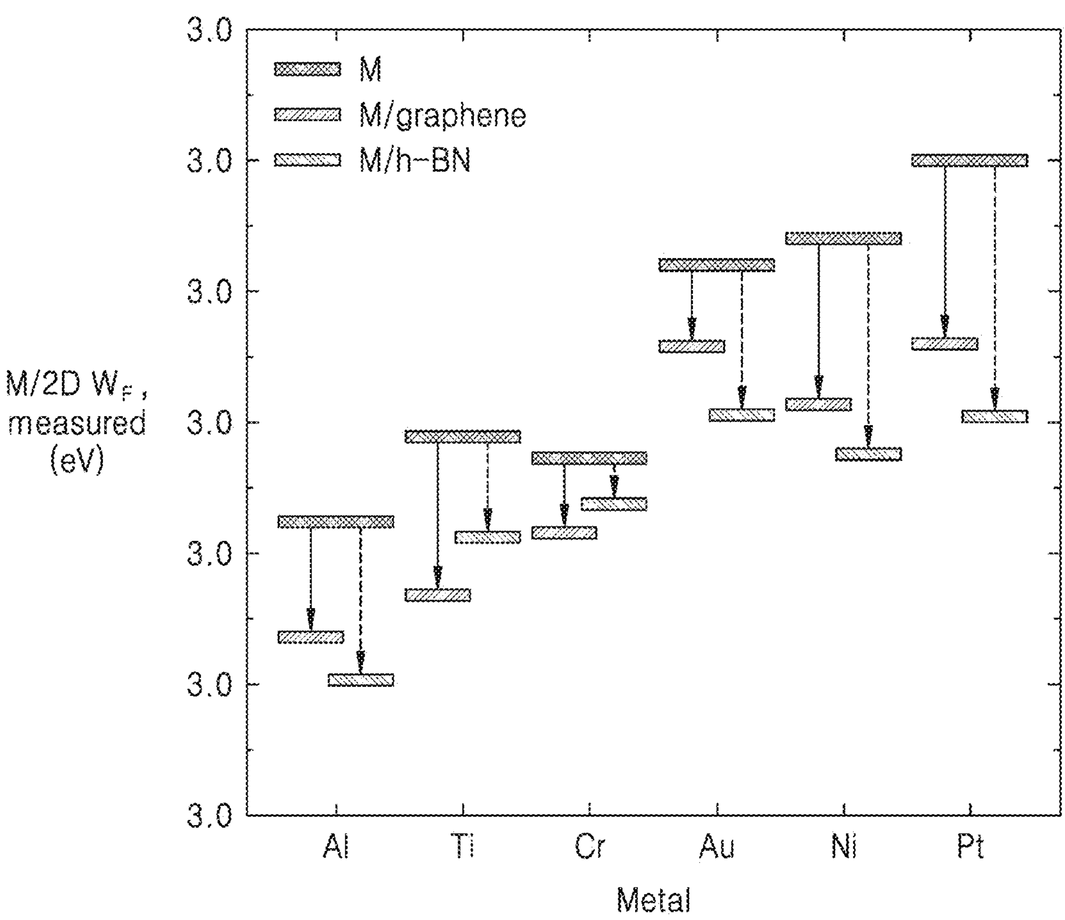
FIG. 3 is a graph illustrating the work functions of various types of metal materials which vary as the various types of metal materials make contact with a two-dimensional material.

FIG. 1 is a plan view illustrating an example structure of a semiconductor element 100 according to an embodiment. FIG. 2 is a cross-sectional view taken along line A-A' of FIG. 1. FIG. 3 is a graph illustrating the work functions of various types of metal materials which vary as the various types of metal materials make contact with a two-dimensional material.

Referring to FIGS. 1 and 2, the semiconductor element 100 may include: a substrate 10 including a trench T1; a source region 71 and a drain region 72, which are formed in the substrate 10 and are separated from each other by the trench T1; a gate insulating layer 60, which covers a bottom surface and a sidewall of the trench T1; a gate electrode 40, which includes a lower buried portion 41 provided in the trench T1 and surrounded by the gate insulating layer 60 to fill a lower region of the trench T1, and an upper buried portion 42 provided on the lower buried portion 41 and surrounded by the gate insulating layer 60 to fill an upper region of the trench T1; and a capping layer 50 provided on the gate electrode 40.

The substrate 10 may include a semiconductor substrate. The substrate 10 may include a silicon-containing material. The substrate 10 may include silicon, single crystal silicon, polysilicon, amorphous silicon, silicon germanium, single crystal silicon germanium, polysilicon germanium, silicon doped with carbon, a combination thereof, or a plurality of layers thereof. The substrate 10 may include another semiconductor material such as germanium. The substrate 10 may include a Group III/V semiconductor substrate, for example, a compound semiconductor substrate such as a GaAs substrate. The substrate 10 may include a silicon on insulator (SOI) substrate. The trench T1 may be formed in the substrate 10 by etching a region of the substrate 10 in a vertical direction z.

The source region 71 and the drain region 72 may be formed in the substrate 10 and may be separated apart from each other in a horizontal direction y by the trench T1. The source region 71 and the drain region 72 may be arranged side by side together with the upper region of the trench T1. For example, upper surfaces of the source region 71 and the drain region 72 and an upper surface of the substrate 10 may be provided on the same plane. In addition, lower surfaces of the source region 71 and the drain region 72 may be higher than the bottom surface of the trench T1. Furthermore, the source region 71 and the drain region 72 may be in contact with the sidewall of the trench T1.

The source region 71 and the drain region 72 may be formed by doping regions of the substrate 10 with dopants. For example, regions of the substrate 10 may be doped with any one of phosphorus (P), arsenic (As), antimony (Sb), and boron (B) to form the source region 71 and the drain region 72.

A gate structure 100G may be provided in the trench T1. The gate structure 100G may include the gate electrode 40, the capping layer 50, and the gate insulating layer 60. The inside of the trench T1 may be partially filled with the gate electrode 40. Therefore, the gate electrode 40 may be referred to as a buried gate electrode. The capping layer 50 may be provided on the gate electrode 40. The gate insulating layer 60 may cover the bottom surface and the sidewall of the trench T1. For example, the gate electrode 40 may partially fill the inside of the trench T1, and the gate insulating layer 60 may be provided between the substrate 10 and the gate electrode 40 to surround the gate electrode 40. Therefore, the gate electrode 40 may not be directly in contact with the bottom surface and the sidewall of the trench T1.

The gate insulating layer 60 may include silicon oxide, silicon nitride, silicon oxynitride, a high-k material, or a combination thereof. The high-k material may include a material, which has a dielectric constant greater than the dielectric constant of silicon oxide. For example, the high-k material may include a material having a dielectric constant of greater than about 3.9. In another example, the high-k material may include a material having a dielectric constant of greater than about 10. In another example, the high-k material may include a material having a dielectric constant of about 10 to about 30. The high-k material may include at least one metallic element. The high-k material may include a hafnium-containing material. The hafnium-containing material may include hafnium oxide, hafnium silicon oxide, hafnium silicon oxynitride, or a combination thereof. In another embodiment, the high-k material may include lanthanum oxide, lanthanum aluminum oxide, zirconium oxide, zirconium silicon oxide, zirconium silicon oxynitride, aluminum oxide, or a combination thereof. Other materials known as materials having a high dielectric constant may be selectively used as the high-k material.

The gate electrode 40 may include the lower buried portion 41 and the upper buried portion 42. The lower buried portion 41 may include a barrier layer 31 and a first conductive layer 32. The barrier layer 31 may cover a bottom surface and a sidewall of the gate insulating layer 60 in the trench T1. The first conductive layer 32 may be filled in the lower region of the trench T1 and surrounded by the barrier layer 31. For example, the first conductive layer 32 may partially fill the lower region of the inside of the trench T1, and the barrier layer 31 may be provided between the gate insulating layer 60 and the first conductive layer 32 to surround the conductive layer 32. Therefore, the first conductive layer 32 may not be directly in contact with the bottom surface and sidewall of the gate insulating layer 60. Diffusion of a metal material of the first conductive layer 32 into the gate insulating layer 60 may be limited and/or prevented by the barrier layer 31. In addition, because the lower buried portion 41 is provided in the lower region of the inside of the trench T1, the source region 71 and the drain region 72, which are arranged side by side together with the upper region of the trench T1, may not overlap each other.

When there is an electrical potential between the source region 71 and the drain region 72, a channel CH may be formed around the lower buried portion 41 provided in the trench T1.

The barrier layer 31 may include titanium nitride. For example, the barrier layer 31 may include TiN. The first conductive layer 32 may include a conductive metal material. For example, the first conductive layer 32 may include tungsten (W). However, embodiments are not limited thereto, and the first conductive layer 32 may include a metal material other than tungsten (W).

The upper buried portion 42 may include a two-dimensional material layer 33 and a second conductive layer 34. In the trench T1, the two-dimensional material layer 33 may cover an upper surface of the first conductive layer 32 and an upper region of the sidewall of the gate insulating layer 60. The second conductive layer 34 may be filled in the upper region of the trench T1 and surrounded by the two-dimensional material layer 33. For example, the second conductive layer 34 may partially fill the upper region of the inside of the trench T1, and the two-dimensional material layer 33 may be provided between the gate insulating layer 60 and the second conductive layer 34 to surround the second conductive layer 34. Therefore, the second conductive layer 34 may not be directly in contact with the bottom surface and sidewall of the gate insulating layer 60. The two-dimensional material layer 33 may surround the second conductive layer 34, but may not cover an upper surface of the second conductive layer 34. Therefore, the upper surface of the second conductive layer 34 and the two-dimensional material layer 33 may not be in contact with each other.

The capping layer 50 may be provided on the upper surface of the second conductive layer 34. In this case, the two-dimensional material layer 33 may extend to a side surface of the capping layer 50. Therefore, the side surface of the capping layer 50 may be surrounded by the two-dimensional material layer 33. For example, the capping layer 50 may be filled in a capping layer trench T2 formed by the upper surface of the second conductive layer 34 and an upper region of an inner sidewall of the two-dimensional material layer 33.

The capping layer 50 may include an insulating material. For example, the capping layer 50 may include silicon nitride, silicon oxynitride, or a combination thereof. In addition, the capping layer 50 may include a combination of silicon nitride and silicon oxide. For example, the capping layer 50 may be formed through lining with silicon nitride and then filling with a spin-on-dielectric (SOD).

Because the two-dimensional material layer 33 covers the upper surface of the first conductive layer 32, a lower surface of the second conductive layer 34 surrounded by the two-dimensional material layer 33 may not be in direct contact with the upper surface of the first conductive layer 32. As described above, the two-dimensional material layer 33 may function as a barrier between the first conductive layer 32 and the second conductive layer 34. Furthermore, because the upper buried portion 42 is provided in the upper region of the inside of the trench T1, the upper buried portion 42 may overlap the source region 71 and the drain region 72 which are arranged side by side together with the upper region of the trench T1.

The two-dimensional material layer 33 may include various types of two-dimensional materials. For example, the two-dimensional material layer 33 may include at least one selected from the group consisting of graphene, black phosphorus, amorphous boron nitride, two-dimensional hexagonal boron nitride (h-BN), phosphorene, and a transition metal dichalcogenide. The transition metal dichalcogenide may include: a metal selected from the group consisting of molybdenum (Mo), tungsten (W), niobium (Nb), vanadium (V), tantalum (Ta), titanium (Ti), zirconium (Zr), hafnium (Hf), technetium (Tc), rhenium (Re), copper (Cu), gallium (Ga), indium (In), tin (Sn), germanium (Ge), and lead (Pb); and a chalcogen selected from the group consisting of sulfur (S), selenium (Se), and tellurium (Te).

The second conductive layer 34 may include a conductive metal material. The second conductive layer 34 may include a metal material different from a material included in the first conductive layer 32. When the metal material included in the second conductive layer 34 is in contact with the two-dimensional material included in the two-dimensional material layer 33, dipoles may be formed at the interface between the metal material and the two-dimensional material, and thus the work function of the second conductive layer 34 may decrease.

For example, the second conductive layer 34 may include at least one selected from the group consisting of aluminum (Al), titanium (Ti), chromium (Cr), gold (Au), nickel (Ni), and platinum (Pt). Referring to FIG. 3, when a metal material such as aluminum (Al), titanium (Ti), chromium (Cr), gold (Au), nickel (Ni), or platinum (Pt) is in contact with a two-dimensional material such as graphene or two-dimensional hexagonal boron nitride (h-BN), the work function of the metal material decreases. However, embodiments are not limited thereto, and the second conductive layer 32 may include various other metal materials other than aluminum (Al), titanium (Ti), chromium (Cr), gold (Au), nickel (Ni), and platinum (Pt) as long as the other metal materials decrease in work function when in contact with a two-dimensional material.

In addition, the work function of the second conductive layer 34 may be less than the work function of the first conductive layer 32. For example, the work function of the second conductive layer 34 may be within the range of about 2 eV to about 5 eV. Gate induced drain leakage (GIDL) may be effectively reduced because the work function of the second conductive layer 34 overlapping the source region 71 and the drain region 72 is sufficiently low. In addition, because the second conductive layer 34 may include the metal material, the conductivity of the gate electrode 40 may be sufficient for the semiconductor element 100 to operate as a switching element.

In addition, when the gate insulating layer 60 may include silicon oxide, different regions of the gate insulating layer 60 may have different dielectric constants. For example, a lower region of the gate insulating layer 60 surrounding the barrier layer 31 may have a first dielectric constant ε1, an upper region of the gate insulating layer 60 surrounding the two-dimensional material layer 33 may have a second dielectric constant ε2, and the first dielectric constant ε1 may be greater than the second dielectric constant ε2. The upper region of the gate insulating layer 60 may include silicon oxycarbide and may thus have a dielectric constant lower than the dielectric constant of the lower region of the gate insulating layer 60 in which silicon oxide is only included. When the upper region of the gate insulating layer 60 has the second dielectric constant ε2 different from the first dielectric constant ε1 of the lower region of the gate insulating layer 60 as described above, the capacitance between the upper buried portion 42 and the drain region 72 may be reduced compared to the case in which both the upper and lower regions of the gate insulating layer 60 have the first dielectric constant ε1, and thus GIDL may be effectively reduced.

Figure 4A:
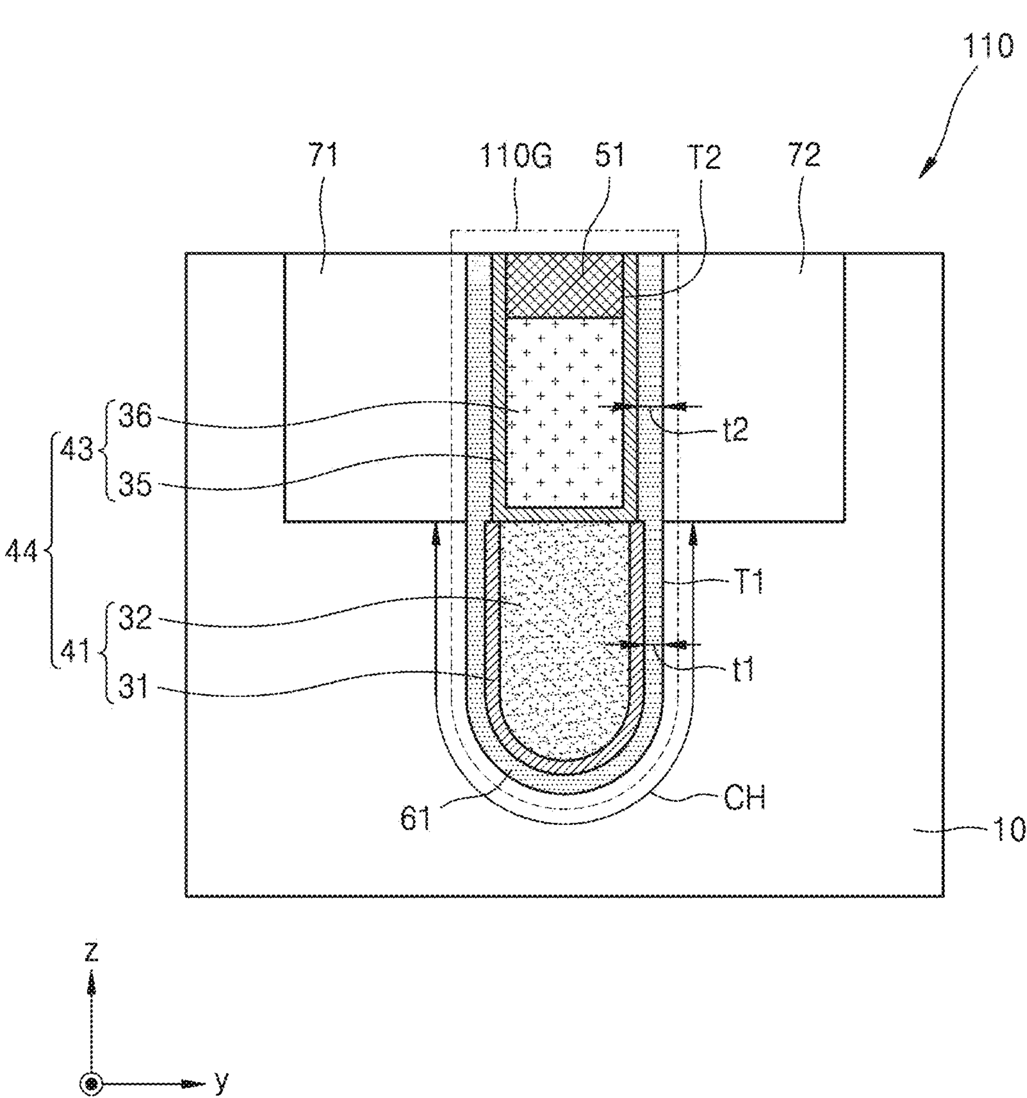
FIG. 4A is a side cross-sectional view illustrating an example structure of a semiconductor element according to another embodiment.

FIG. 4A is a side cross-sectional view illustrating an example structure of a semiconductor element 110 according to another embodiment. The semiconductor element 110 shown in FIG. 4A may be substantially the same as the semiconductor element 100 shown in FIG. 2 except that an upper region and a lower region of a gate insulating layer 61 have different thicknesses. In the following description with reference to FIG. 4A, descriptions that are the same as those given with reference to FIGS. 1 to 3 will not be presented.

Referring to FIG. 4A, the semiconductor element 110 may include: a substrate 10 including a trench T1; a source region 71 and a drain region 72, which are formed in the substrate 10 and are separated apart from each other by the trench T1; the gate insulating layer 61 covering a bottom surface and a sidewall of the trench T1; a gate electrode 44, which includes a lower buried portion 41 provided in the trench T1 and surrounded by the gate insulating layer 61 to fill a lower region of the trench T1, and an upper buried portion 43 provided on the lower buried portion 41 and surrounded by the gate insulating layer 61 to fill an upper region of the trench T1; and a capping layer 51 provided on the upper buried portion 43.

The gate insulating layer 61 may cover the bottom surface and the sidewall of the trench T1. For example, the gate electrode 44 may partially fill the inside of the trench T1, and the gate insulating layer 61 may be provided between the substrate 10 and the gate electrode 44 to surround the gate electrode 44. Therefore, the gate electrode 44 may not be directly in contact with the bottom surface and the sidewall of the trench T1.

In addition, regions of the gate insulating layer 61 may have different thicknesses. For example, the lower region of the gate insulating layer 61 surrounding a barrier layer 31 may have a first thickness t1, which is less than a second thickness t2 of the upper region of the gate insulating layer 61 surrounding a two-dimensional material layer 35. As described above, when the upper region of the gate insulating layer 61 has the second thickness t2 instead of having the same thickness as the first thickness t1 of the lower region of the gate insulating layer 61, the capacitance between the upper buried portion 43 and the drain region 72 may be reduced, and thus GIDL may be effectively reduced.

The upper buried portion 43 may include the two-dimensional material layer 35 and a second conductive layer 36. The upper buried portion 43 may be substantially the same as the upper buried portion 42 shown in FIG. 2 except that the upper buried portion 43 has a relatively small width because the thickness of the upper region of the gate insulating layer 61 is relatively large.

The capping layer 51 may be substantially the same as the capping layer 50 shown in FIG. 2 except that the capping layer 51 has a relatively small width because the width of the two-dimensional material layer 35 is relatively small. For example, the capping layer 51 may be filled in a capping layer trench T2 formed by an upper surface of the second conductive layer 36 and an upper region of an inner sidewall of the two-dimensional material layer 35.

Figure 4B:
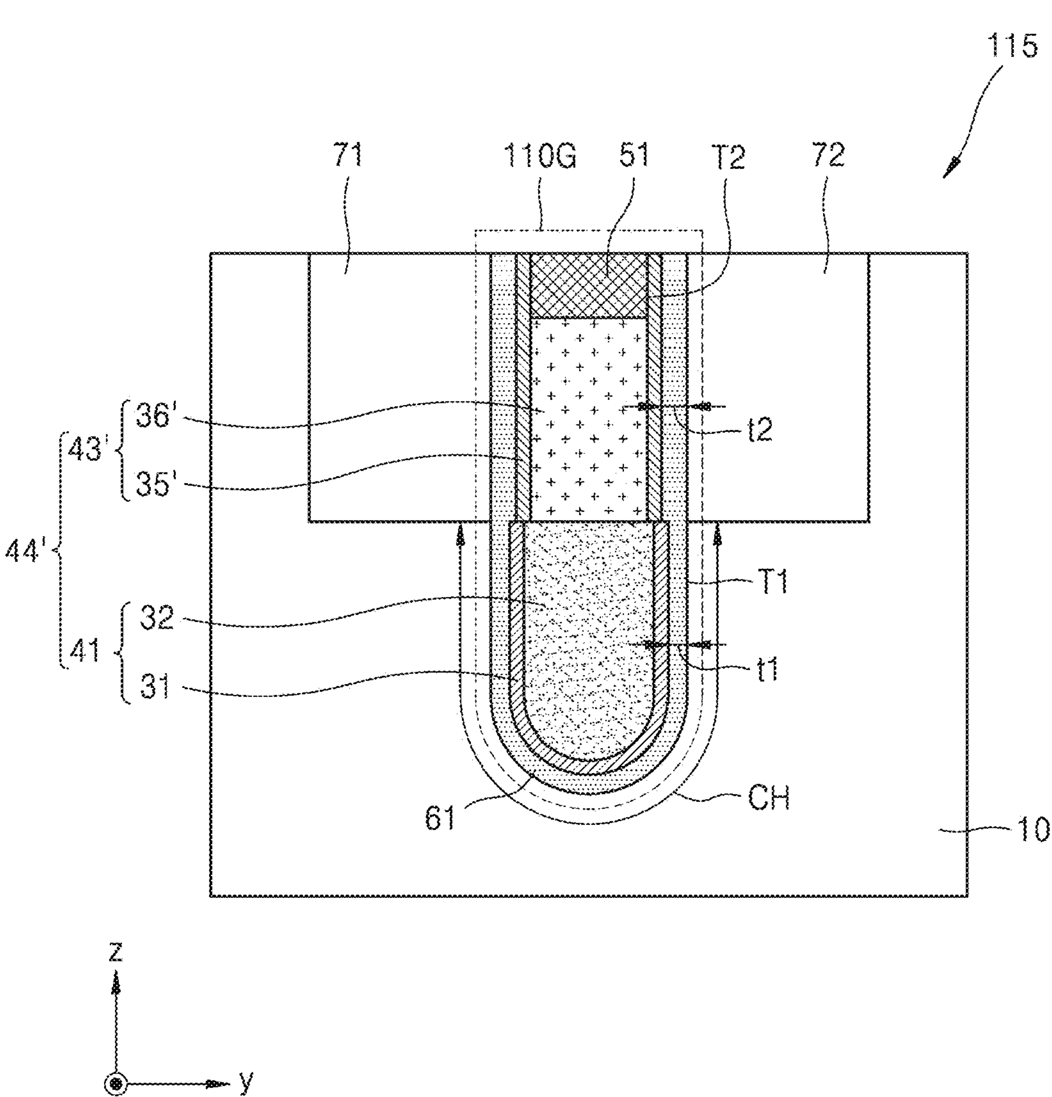
FIG. 4B is a side cross-sectional view illustrating an example structure of a semiconductor element according to another embodiment.

FIG. 4B is a side cross-sectional view illustrating an example structure of a semiconductor element 115 according to another embodiment. In the following description with reference to FIG. 4B, descriptions that are the same as those given with reference to FIGS. 1 to 4A will not be presented.

As illustrated in FIG. 4B, the semiconductor element 115 shown in FIG. 4B may be substantially the same as the semiconductor element 110 shown in FIG. 4A except the first conductive layer 32 and the second conductive layer 36' may directly contact each other. In FIG. 4B, the upper buried portion 43' may include a two-dimensional material layer 35' that covers side surfaces of the capping layer 51 and the second conductive layer 36', but the two-dimensional material layer 35' does not extend between the bottom surface of the second conductive layer 36' and the upper surface of the first conductive layer 32. Thus, the gate electrode 44' of the semiconductor element 115 may have a different structure than the gate electrode 44 of the semiconductor element 110 in FIG. 4A.

Figure 5:
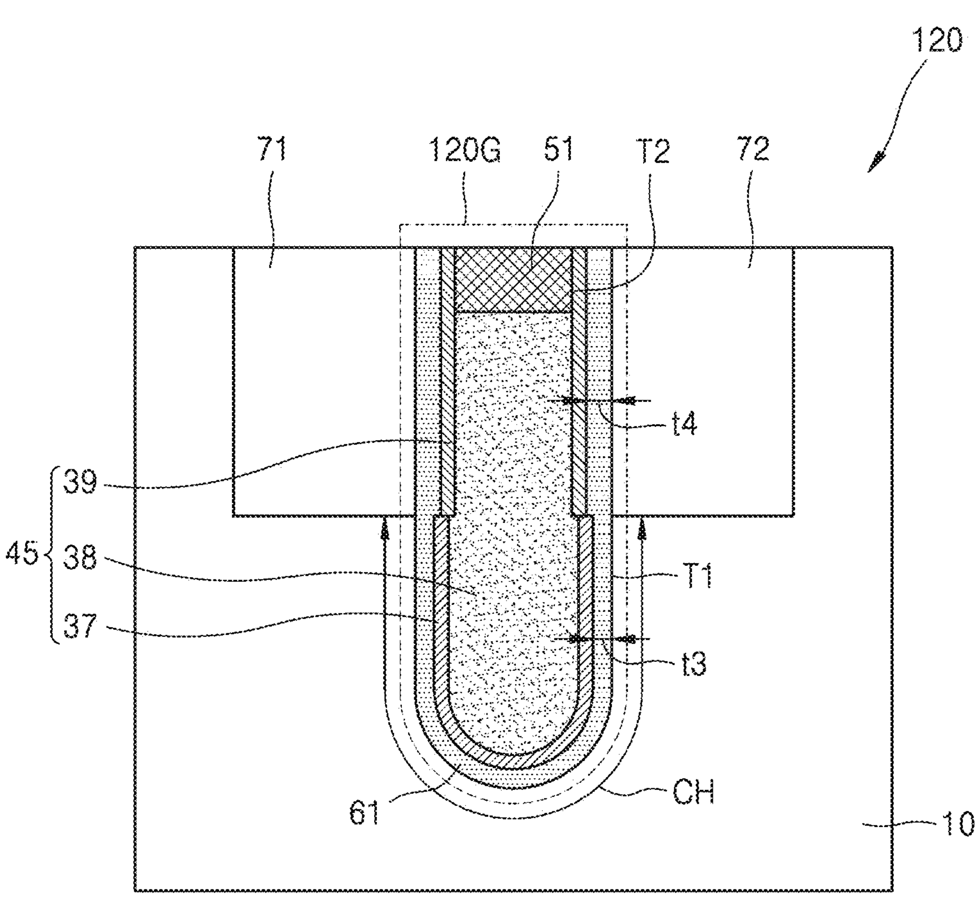
FIG. 5 is a side cross-sectional view illustrating an example structure of a semiconductor element according to another embodiment.
Figure 5:
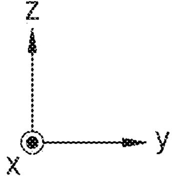

FIG. 5 is a side cross-sectional view illustrating an example structure of a semiconductor element 120 according to another embodiment. The semiconductor element 120 shown in FIG. 5 may be substantially the same as the semiconductor element 110 shown in FIG. 4A except that includes a single conductive layer 38 unlike the gate electrode 44 of FIG. 4A which includes the first conductive layer 32 and the second conductive layer 36. In the following description with reference to FIG. 5, descriptions that are the same as those given with reference to FIGS. 1 to 4A will not be limited and/or prevented.

Referring to FIG. 5, the semiconductor element 120 may include: a substrate 10 including a trench T1; a source region 71 and a drain region 72, which are formed in the substrate 10 and are separated from each other by the trench T1; a gate insulating layer 61 covering a bottom surface and a sidewall of the trench T1; a gate electrode 45 provided in the trench T1 and surrounded by the gate insulating layer 61; and a capping layer 51 provided on the gate electrode 45.

The gate electrode 45 may include: a barrier layer 37 provided in the trench T1 and surrounded by the gate insulating layer 61 to cover a bottom surface of the gate insulating layer 61 and a lower region of a sidewall of the gate insulating layer 61; a two-dimensional material layer 39 provided in the trench T1 and covering an upper region of the sidewall of the gate insulating layer 61; and the conductive layer 38 filling the trench T1 and surrounded by the barrier layer 37 and the two-dimensional material layer 39. A lower region of the conductive layer 38 may be surrounded by the barrier layer 37, and an upper region of the conductive layer 38 may be surrounded by the two-dimensional material layer 39.

The conductive layer 38 may include a conductive metal material. The conductive layer 38 may include the same metal material as the second conductive layer 36 shown in FIG. 4A. The work function of the upper region of the conductive layer 38, which is in contact with the two-dimensional material layer 39, may be less than the work function of the lower region of the conductive layer 38, which is in contact with the barrier layer 37. For example, the conductive layer 38 may include at least one selected from the group consisting of aluminum (Al), titanium (Ti), chromium (Cr), gold (Au), nickel (Ni), and platinum (Pt).

Figure 6:
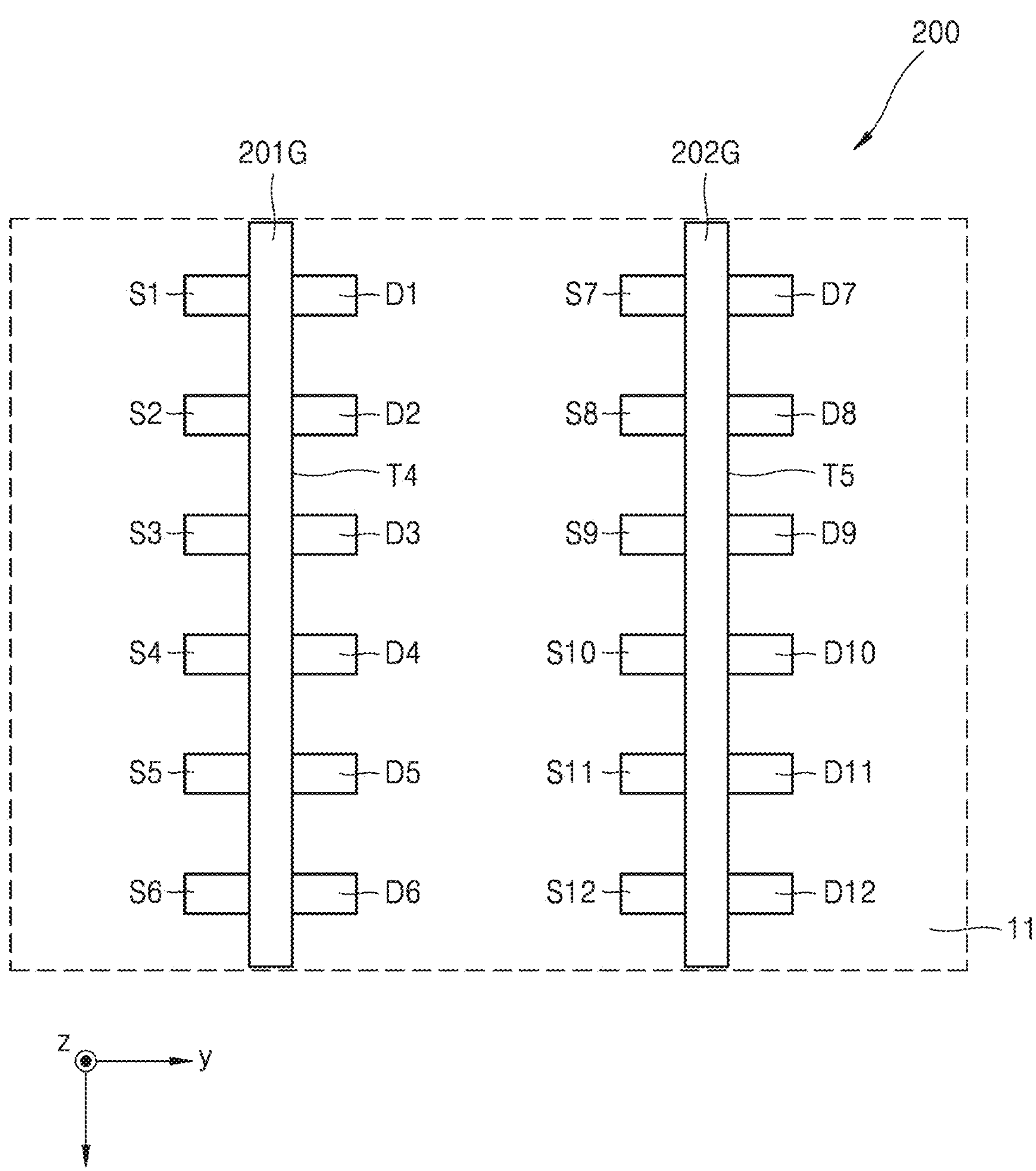
FIG. 6 is a view schematically illustrating an example structure of a semiconductor element array according to an embodiment.

FIG. 6 is a view schematically illustrating an example structure of a semiconductor element array 200 according to an embodiment.

Referring to FIG. 6, the semiconductor element array 200 may include: a substrate 11 including a plurality of trenches T4 and T5; a plurality of gate structures 201G and 202G provided in the trenches T4 and T5; and a plurality of source regions S1 to S12 and a plurality of drain regions D1 to D12, which are apart from each other with the trenches T4 and T5 therebetween.

The trenches T4 and T5 may extend in the substrate 11 in a first direction x and may be arranged side by side in a second direction y crossing the first direction x. Here, the first direction x and the second direction y may be perpendicular to each other. A first gate structure 201G of the gate structures 201G and 202G may be provided in a first trench T4 of the trenches T4 and T5. In addition, a second gate structures 202G of the gate structures 201G and 202G may be provided in a second trenches T5 of the trenches T4 and T5. Like the trenches T4 and T5, the gate structures 201G and 202G may extend in the first direction x and may be arranged side by side in the second direction y.

The source regions S1 to S12 and the drain regions D1 to D12 may share one of the gate structures 201G and 202G. For example, the source regions S1 to S6 and the drain regions D1 to D6 may be opposite each other with the first gate structure 201G therebetween. In addition, the source regions S7 to S12 and the drain regions D7 to D12 may be opposite each other with the second gate structure 202G therebetween. A first semiconductor element may be formed by: the first gate structure 201G; and a first source region S1 of the source regions S1 to S12 and a first drain region D1 of drain regions D1 to D12, which are opposite each other with the first gate structure 201G therebetween. The first semiconductor element may include any one of the semiconductor elements 100, 110, 115, and 120 described with reference to FIGS. 1 to 5. In this manner, a plurality of semiconductor elements may be formed along each of the gate structures 201G and 202G.

Figure 7:
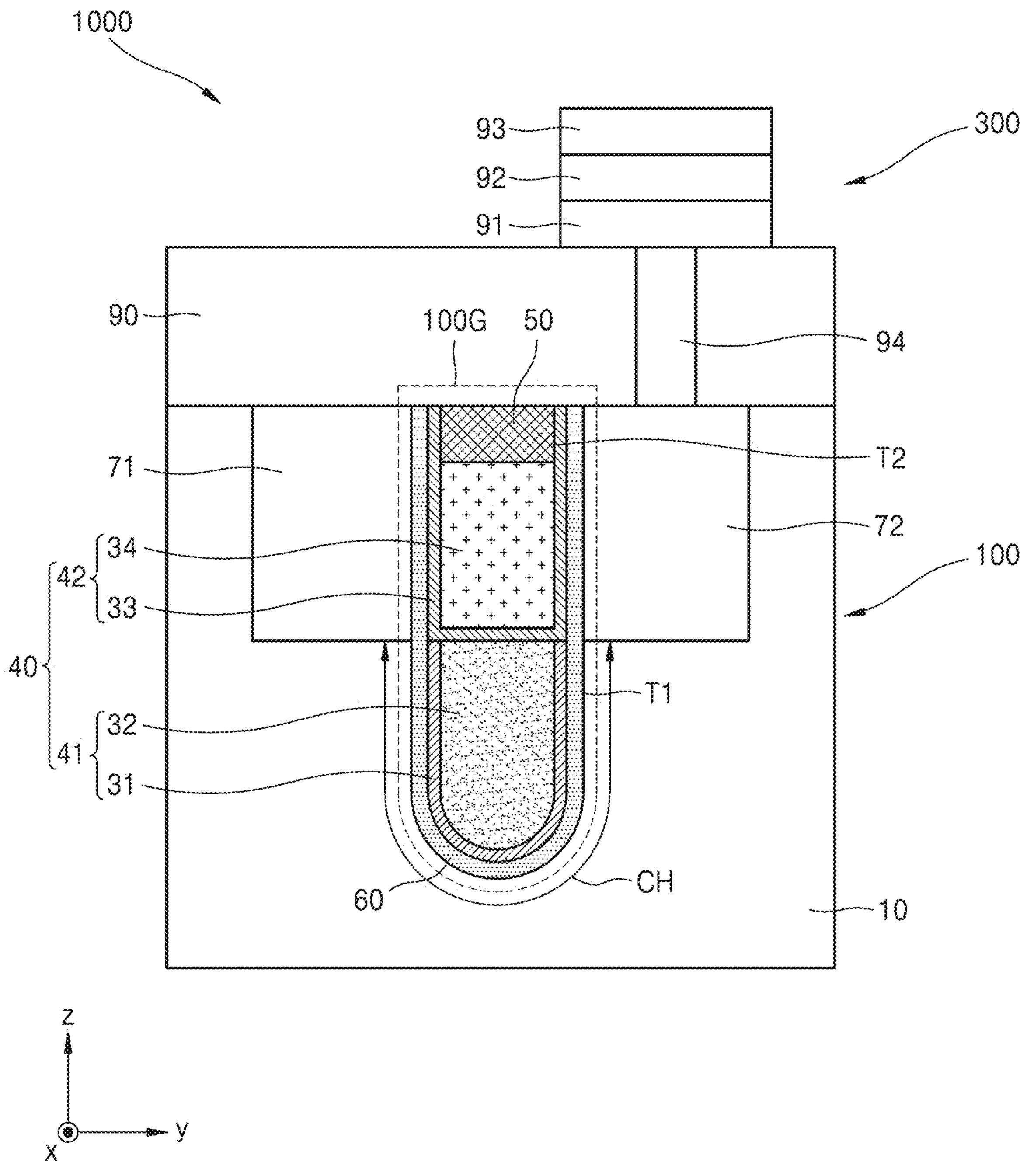
FIG. 7 is a view schematically illustrating an example structure of a memory device according to an embodiment.

FIG. 7 is a view schematically illustrating an example structure of a memory device 1000 according to an embodiment.

Referring to FIG. 7, the memory device 1000 may include a semiconductor element 100 and a capacitor 300. The semiconductor element 100 is the same as the semiconductor element 100 described with reference to FIGS. 1 and 2. However, embodiments are not limited thereto, and the memory device 1000 may include any one of the semiconductor elements 110, 115, and 120 described with reference to FIGS. 4A, 4B, and 5. In the following description given with reference to FIG. 7, refer to descriptions given with reference to FIG. 2.

The semiconductor element 100 may operate as a switching element. The capacitor 300 may be provided on the semiconductor element 100. For example, an interlayer insulating layer 90 may be provided on a substrate 10 to cover a source region 71, a drain region 72, and a gate structure 100G. The interlayer insulating layer 90 may include an insulating material. For example, the insulating interlayer 90 may include silicon oxide (such as $SiO_2$) or aluminum oxide (such as $Al_2O_3$). The capacitor 300 may be provided on the interlayer insulating layer 90. The capacitor 300 may include a lower electrode 91 provided on the interlayer insulating film 90, a dielectric layer 92 provided on the lower electrode 91, and an upper electrode 93 provided on the dielectric film 92. The lower electrode 91 and the upper electrode 93 may include various types of conductive materials. The dielectric layer 92 may include various types of insulating materials.

A via hole may be formed in a region of the interlayer insulating layer 90, and a contact 94 may be filled in the via hole. The contact 94 may include various types of conductive materials. For example, the via hole may expose the drain region 72, and the contact 94 may be in contact with the drain region 72. The capacitor 300 may be provided on the interlayer insulating layer 90 and be in contact with the contact 94. Therefore, the capacitor 300 may be electrically connected to the drain region 72 through the contact 94.

FIGS. 8 to 16 are views illustrating a method of fabricating a semiconductor element according to an embodiment.

Figure 8:
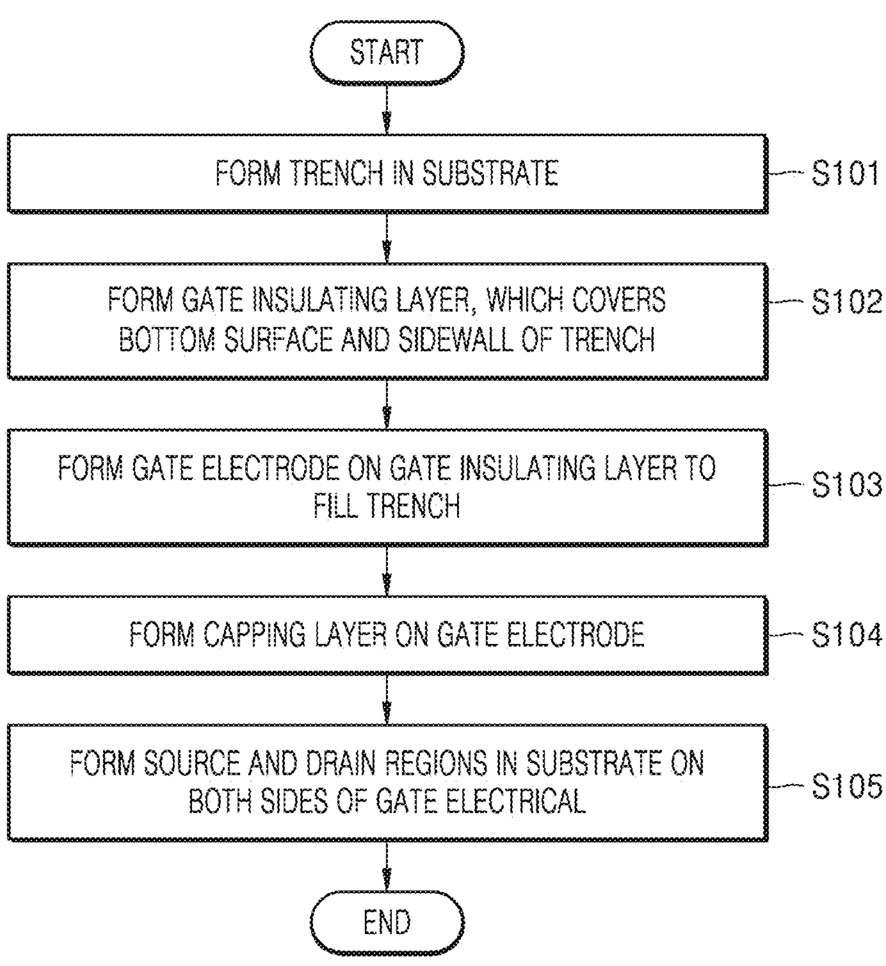
FIGS. 8 to 16 are views illustrating a method of fabricating a semiconductor element according to an embodiment.

Referring to FIG. 8, the semiconductor element fabricating method of the embodiment may include: an operation S101 of forming a trench in a substrate; an operation S102 of forming a gate insulating layer to cover a bottom surface and a sidewall of the trench; an operation S103 of forming a gate electrode on the gate insulating layer to fill the trench; an operation S104 of forming a capping layer on the gate electrode; and an operation S105 of forming a source region and a drain region in the substrate on both sides of the gate electrode.

Figure 9:
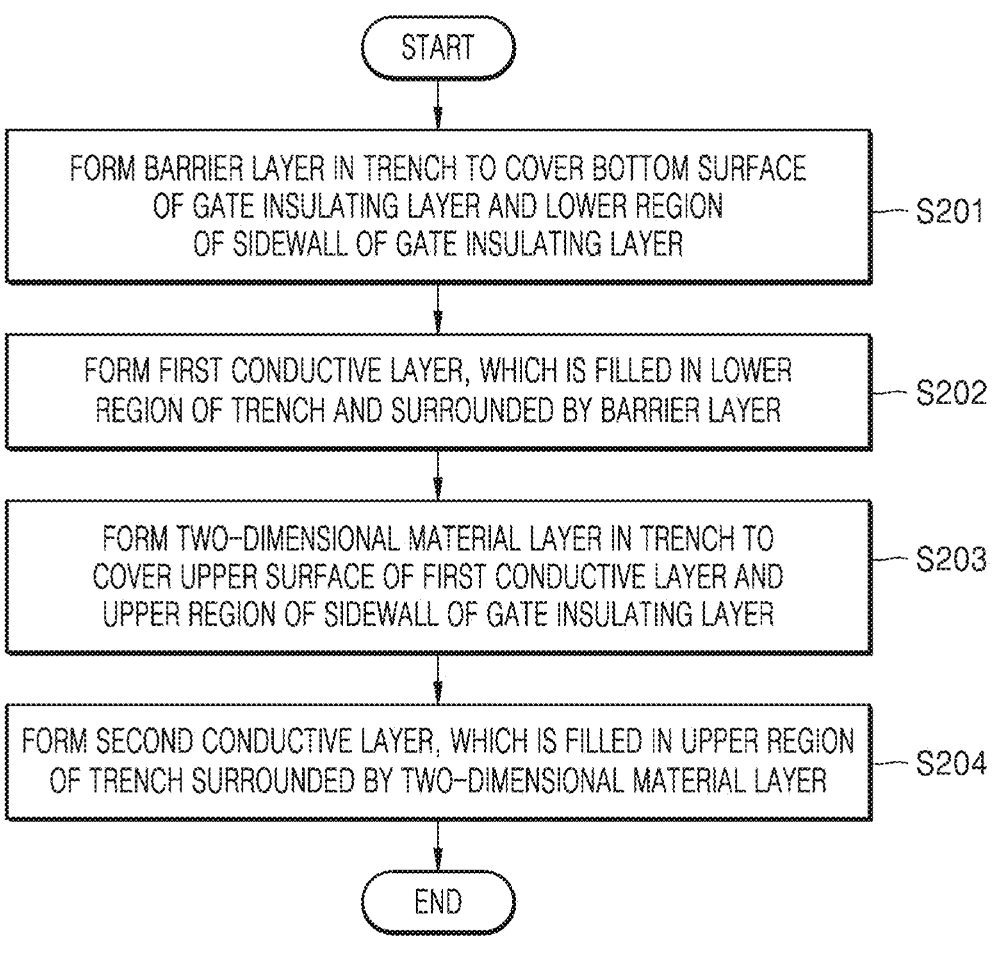

Furthermore, in the operation S103 of forming the gate electrode, the gate electrode may be formed to include a barrier layer, a first conductive layer, a two-dimensional material layer, and a second conductive layer. For example, as shown in FIG. 9, the operation S103 of forming the gate electrode may include: an operation S201 of forming the barrier layer in the trench to cover a bottom surface of the gate insulating layer and a lower region of a sidewall of the gate insulating layer; an operation S202 of forming the first conductive layer which is filled in a lower region of the trench and surrounded by the barrier layer; an operation S203 of forming the two-dimensional material layer in the trench to cover an upper surface of the first conductive layer and an upper region of the sidewall of the gate insulating layer; and operation S204 of forming the second conductive layer which is filled in an upper region of the trench and surrounded by the two-dimensional material layer.

Figure 10:
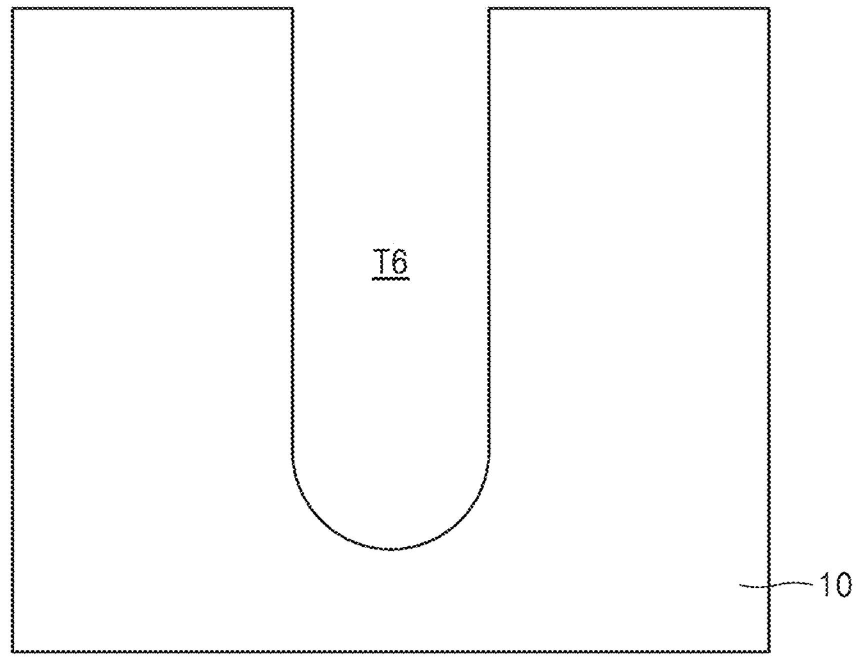
Figure 10:
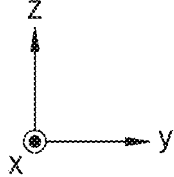

For example, referring to FIG. 10, a trench T6 may be formed by patterning a portion of a substrate 10.

Figure 11:
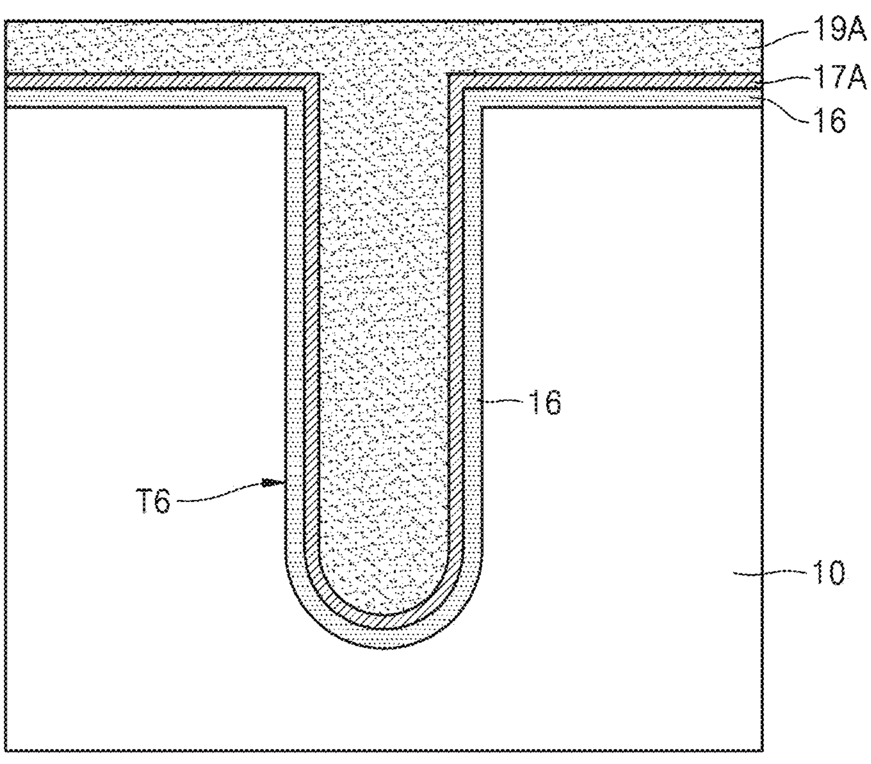
Figure 11:
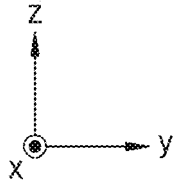

Referring to FIG. 11, a gate insulating layer 16 may be formed on the substrate 10 to cover a bottom surface and a sidewall of the trench T6. A preliminary barrier layer 17A may be formed on the gate insulating layer 16. A first preliminary conductive layer 19A, which fills the trench T6, may be formed on the preliminary barrier layer 17A.

Figure 12:
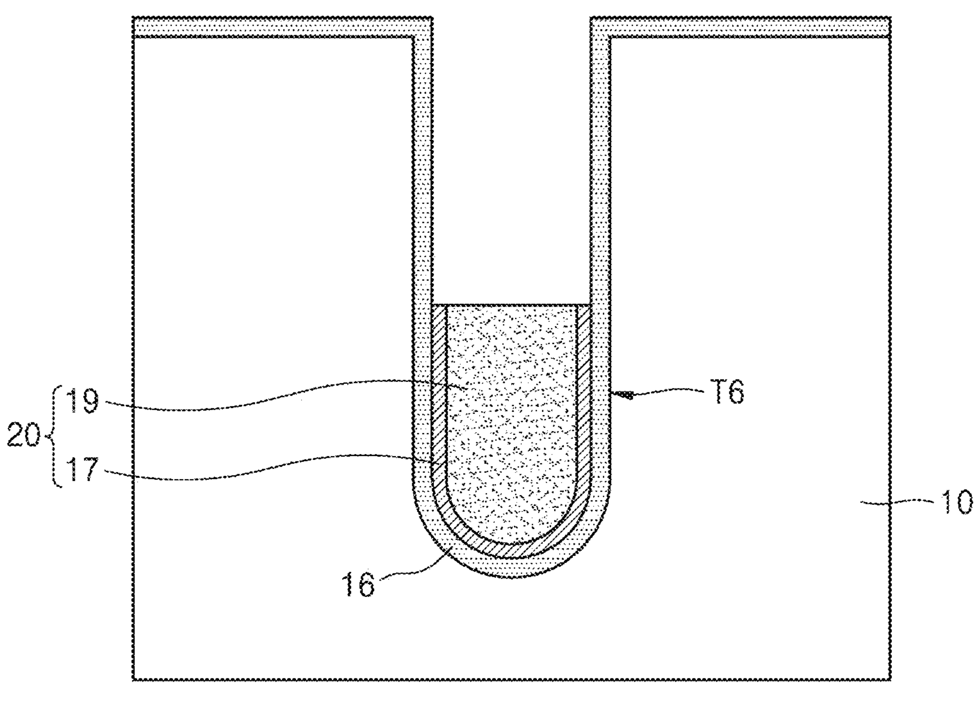
Figure 12:
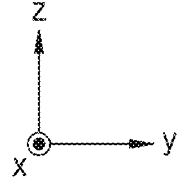

Referring to FIG. 12, a lower buried portion 20, which is in contact with a lower region of a sidewall of the gate insulating layer 16 in the trench T6, may be formed by patterning the preliminary barrier layer 17A and the first preliminary conductive layer 19A. The lower buried portion 20 may include: a barrier layer 17, which covers a bottom surface of the gate insulating layer 16 and the lower region of the sidewall of the gate insulating layer 16; and a first conductive layer 19, which is filled in a lower region of the trench T6 and surrounded by the barrier layer 17.

Figure 13:
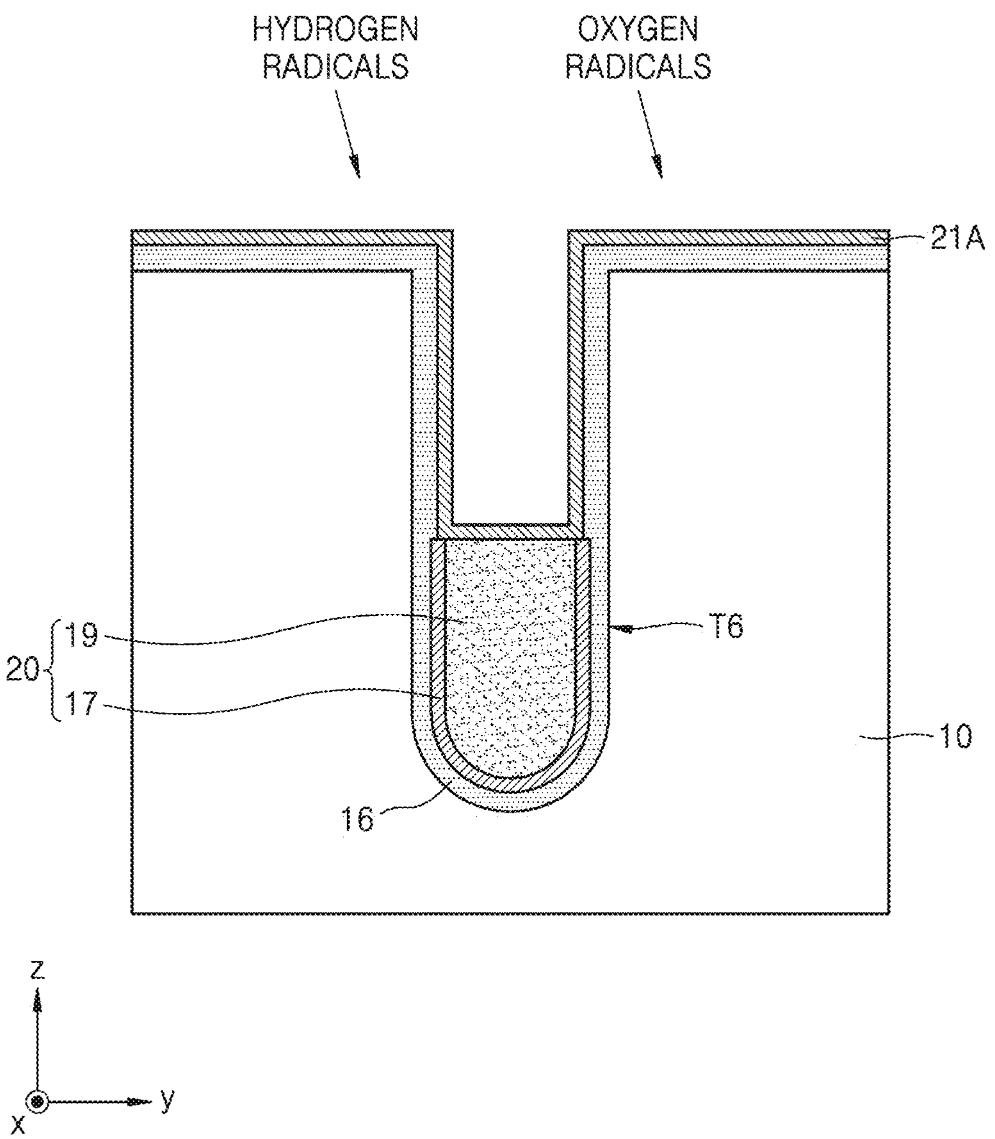

Referring to FIG. 13, a preliminary two-dimensional material layer 21A, which covers an upper surface of the first conductive layer 19 and the gate insulating layer 16, may be formed. The preliminary two-dimensional material layer 21A may be formed using chemical vapor deposition (CVD).

When the preliminary two-dimensional material layer 21A is formed by CVD, hydrogen radicals may be supplied. In this case, when the gate insulating layer 16 adjacent to the preliminary two-dimensional material layer 21A includes silicon oxide, the composition of an upper region of the gate insulating layer 16 may be changed to silicon oxycarbide, and thus the upper region of the gate insulating layer 16 may have a dielectric constant less than the dielectric constant of a lower region of the gate insulating layer 16, which includes only silicon oxide.

In addition, when the preliminary two-dimensional material layer 21A is formed by CVD, oxygen radicals may be supplied. In this case, the thickness of the gate insulating layer 16 adjacent to the preliminary two-dimensional material layer 21A may increase. Therefore, the thickness of the upper region of the gate insulating layer 16 may be greater than the thickness of the lower region of the gate insulating layer 16.

Figure 14:
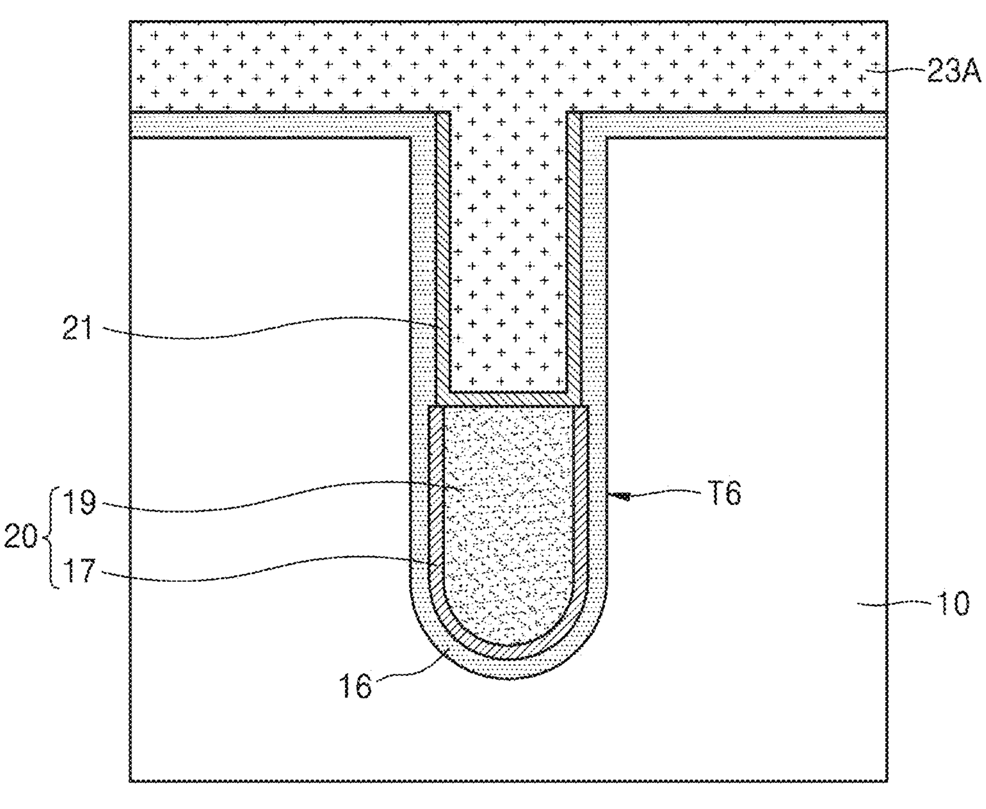
Figure 14:
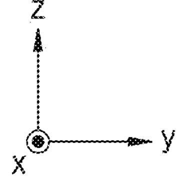

Referring to FIG. 14, the preliminary two-dimensional material layer 21A may be patterned to form a two-dimensional material layer 21, which covers the upper surface of the first conductive layer 19 and an upper region of the sidewall of the gate insulating layer 16. In addition, a second preliminary conductive layer 23A, which fills an upper region of the trench T6, may be formed on the gate insulating layer 16.

Figure 15:
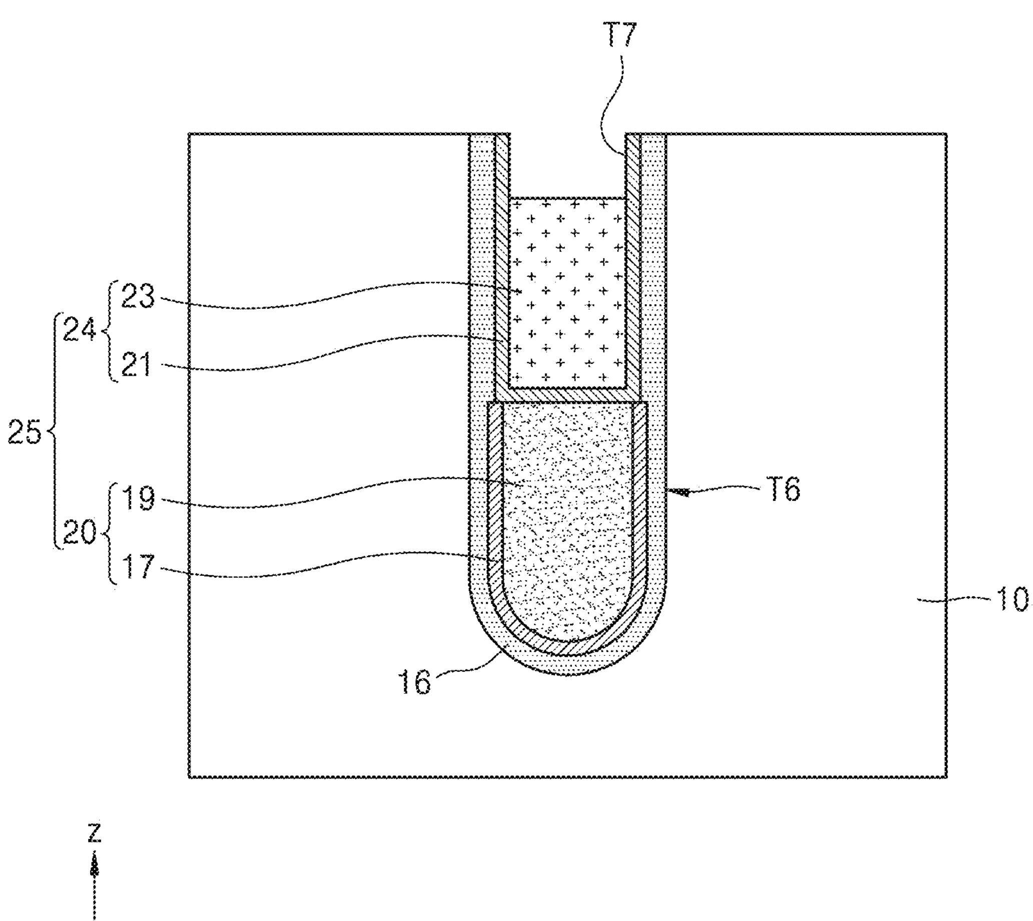

Referring to FIG. 15, a second conductive layer 23, which is partially filled in the upper region of the trench T6 and is surrounded by the two-dimensional material layer 23, may be formed by patterning the preliminary second conductive layer 23A. For example, an upper surface of the second conductive layer 23 may be lower than an upper surface of the substrate 10. Therefore, a capping layer trench T7, through which the gate insulating layer 16 is partially exposed, may be formed. In addition, when the preliminary second conductive layer 23A is patterned, a portion of the gate insulating layer 16 provided on the upper surface of the substrate 10 may also be patterned.

Figure 16:
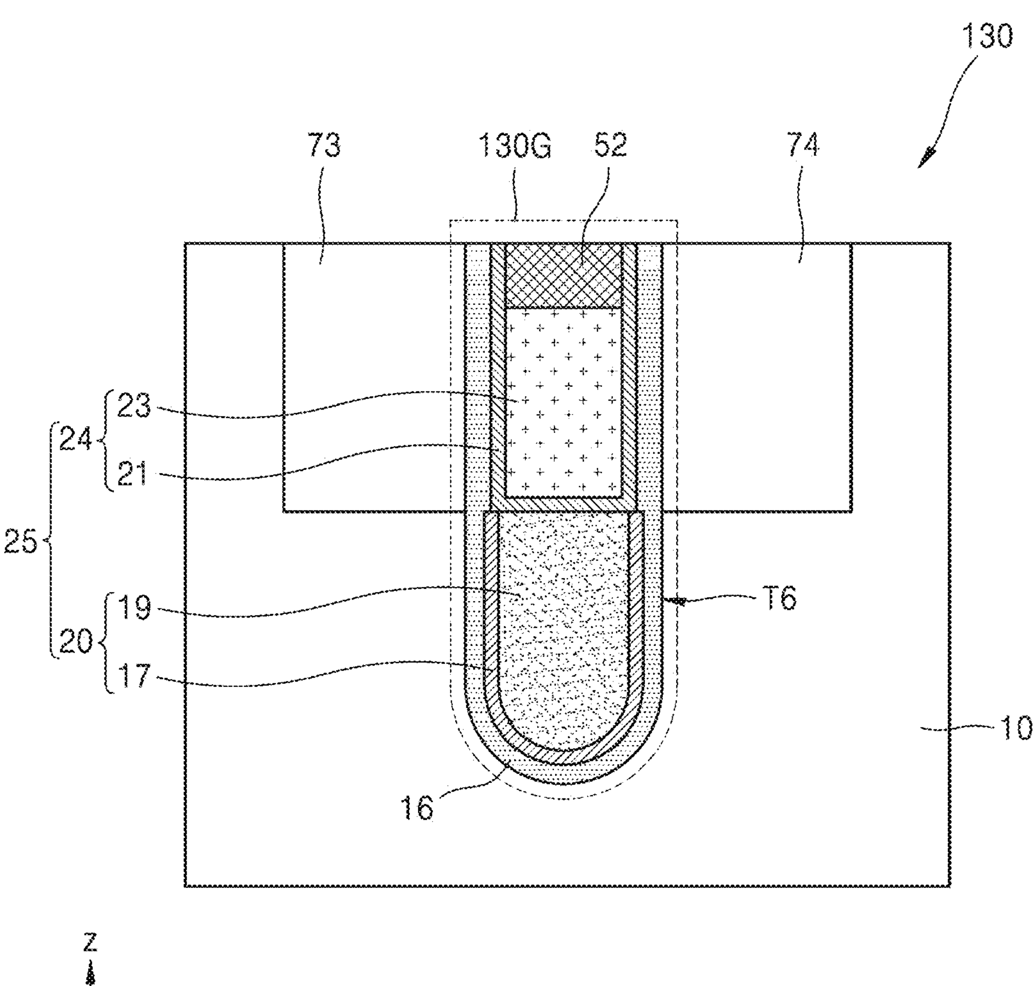
Figure 16:
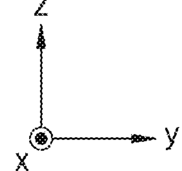

Referring to FIG. 16, a capping layer 52, which fills the capping layer trench T7, may be formed.

A semiconductor element 130 may be formed as shown in FIG. 16 by the semiconductor element fabricating method described with reference to FIGS. 8 to 16. The semiconductor element 130 may have a structure in which a gate structure 130G is provided in the trench T6. The semiconductor element 130 may be substantially the same as the semiconductor element 110 shown in FIG. 4A.

FIGS. 17 to 22 are views illustrating a method of fabricating a semiconductor element according to another example embodiment.

Figure 17:
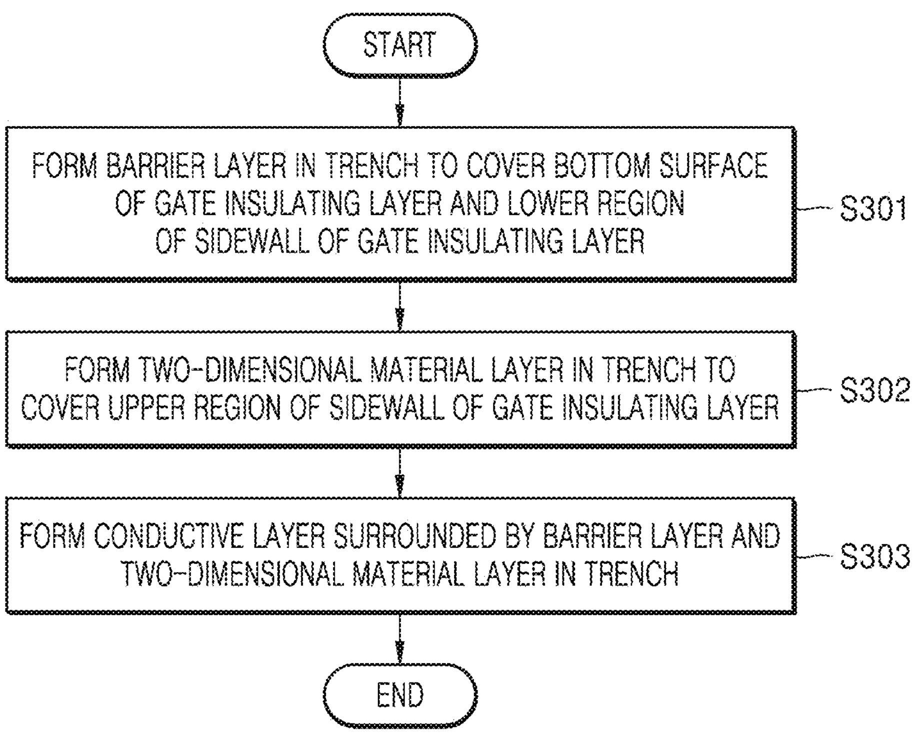
FIGS. 17 to 22 are views illustrating a method of fabricating a semiconductor element according to another embodiment.

In the operation S103 shown in FIG. 8, a gate electrode including a barrier layer, a two-dimensional material layer, and a conductive layer may be formed. For example, as shown in FIG. 17, the operation S103 of forming a gate electrode may include: an operation S301 of forming a barrier layer in a trench to cover a bottom surface of a gate insulating layer and a lower region of a sidewall of the gate insulating layer; an operation S302 of forming a two-dimensional material layer in the trench to cover an upper region of the sidewall of the gate insulating layer; and an operation S303 of forming a conductive layer surrounded by the barrier layer and the two-dimensional material layer in the trench.

Figure 18:
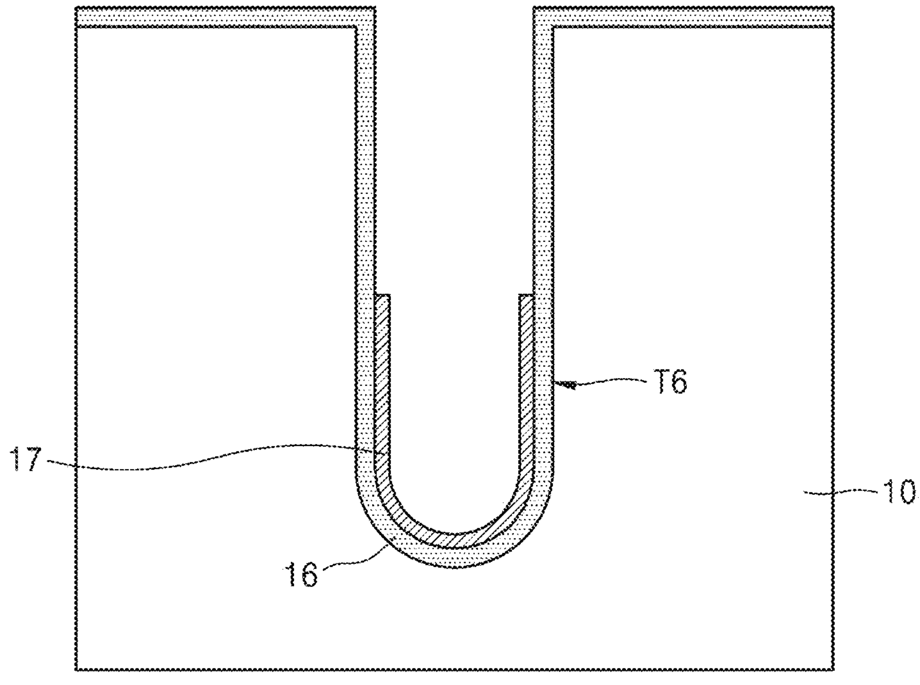
Figure 18:
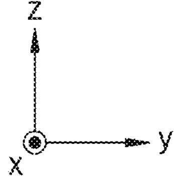

For example, referring to FIG. 18, a portion of a substrate 10 may be patterned to form a trench T6, and a gate insulating layer 16, which covers a bottom surface and a sidewall of the trench T6, may be formed on the substrate 10. A barrier layer 17 may be formed on the gate insulating layer 16 to cover a bottom surface of the gate insulating layer 16 and a lower region of a sidewall of the gate insulating layer 16.

Figure 19:
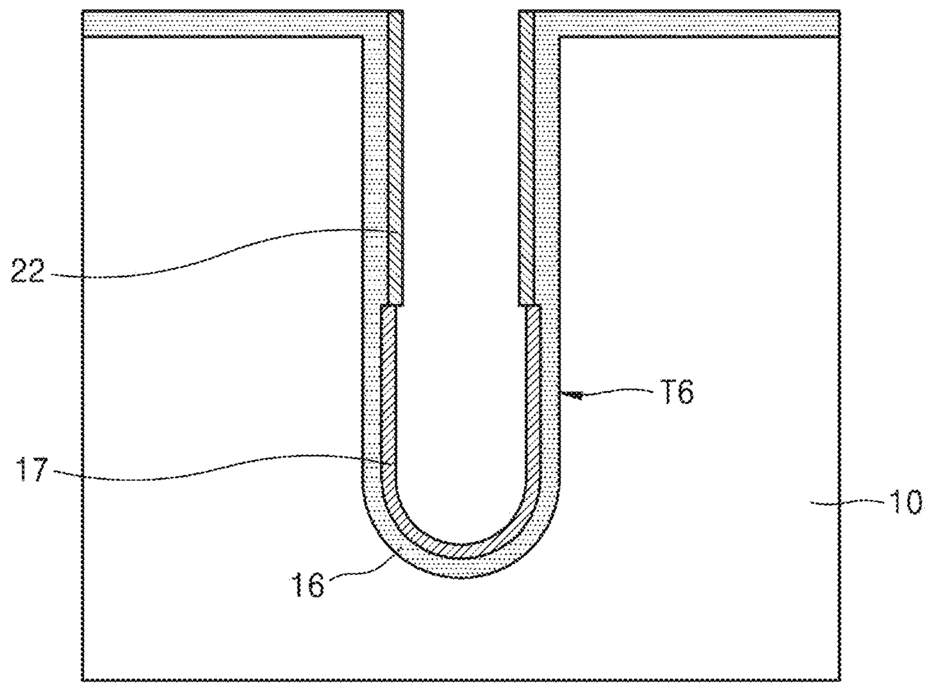
Figure 19:
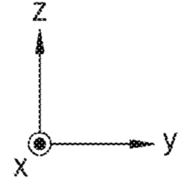

Referring to FIG. 19, a two-dimensional material layer 22, which covers an upper region of the sidewall of the gate insulating layer 16, may be formed. In this case, an upper end of the barrier layer 17 and a lower end of the two-dimensional material layer 22 may be in contact with each other. For example, a preliminary two-dimensional material layer may be formed by CVD.

When the two-dimensional material layer 22 is formed by CVD, hydrogen radicals may be supplied. In this case, when the gate insulating layer 16 adjacent to the two-dimensional material layer 22 includes silicon oxide, the composition of an upper region of the gate insulating layer 16 may be changed to silicon oxycarbide, and thus the upper region of the gate insulating layer 16 may have a dielectric constant less than the dielectric constant of a lower region of the gate insulating layer 16, which includes only silicon oxide.

In addition, when the two-dimensional material layer 22 is formed by CVD, oxygen radicals may be supplied. In this case, the thickness of the gate insulating layer 16 adjacent to the two-dimensional material layer 22 may increase. Therefore, the thickness of the upper region of the gate insulating layer 16 may be greater than the thickness of the lower region of the gate insulating layer 16.

Figure 20:
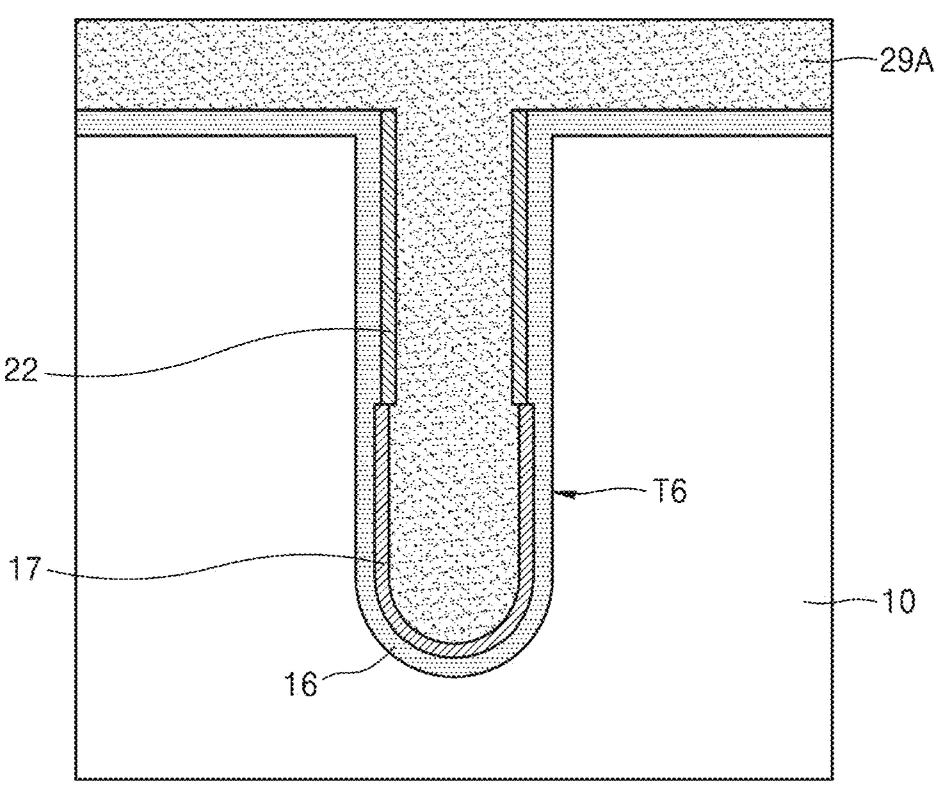
Figure 20:
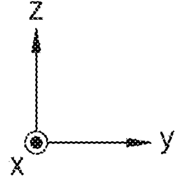

Referring to FIG. 20, a preliminary conductive layer 29A, which fills the trench T6, may be formed on the gate insulating layer 16.

Figure 21:
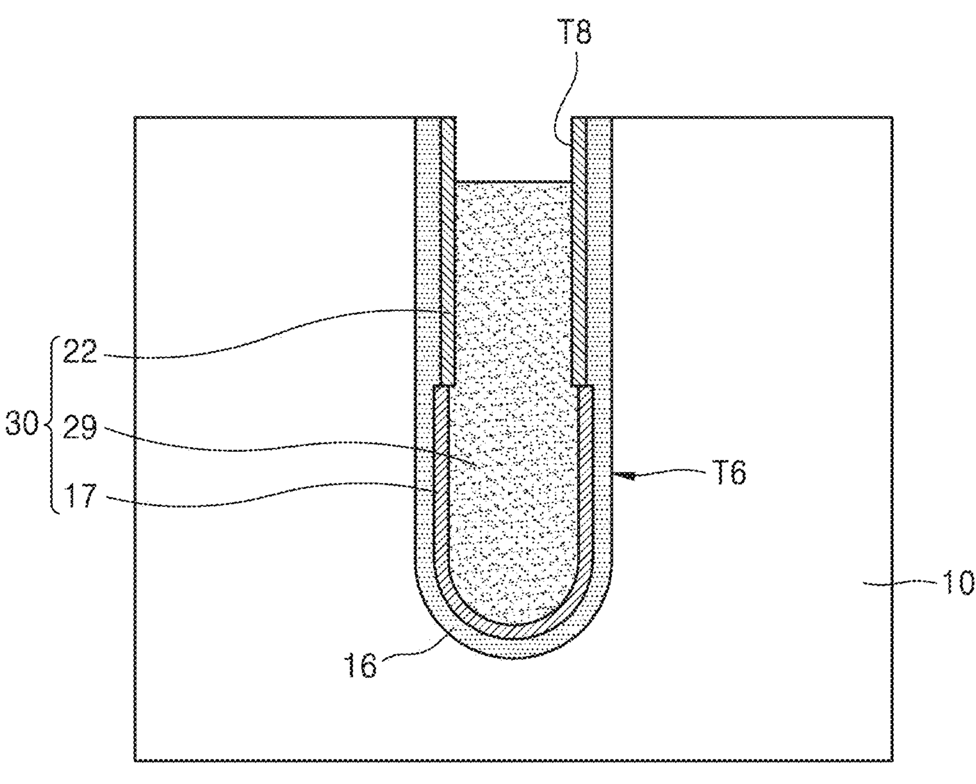
Figure 21:
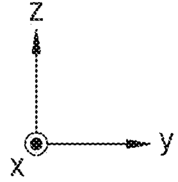

Referring to FIG. 21, the preliminary conductive layer 29A may be patterned to form a conductive layer 29, which is partially filled in the trench T6 and is surrounded by the barrier layer 17 and the two-dimensional material layer 22. In this case, a lower region of the conductive layer 29 may be surrounded by the barrier layer 17, and an upper region may be surrounded by the two-dimensional material layer 22. In addition, an upper surface of the conductive layer 29 may be lower than the upper surface of the substrate 10. Therefore, a capping layer trench T8, through which a portion of the gate insulating layer 16 is exposed, may be formed. In addition, when the preliminary second conductive layer 29A is patterned, a portion of the gate insulating layer 16 provided on the upper surface of the substrate 10 may also be patterned.

Figure 22:
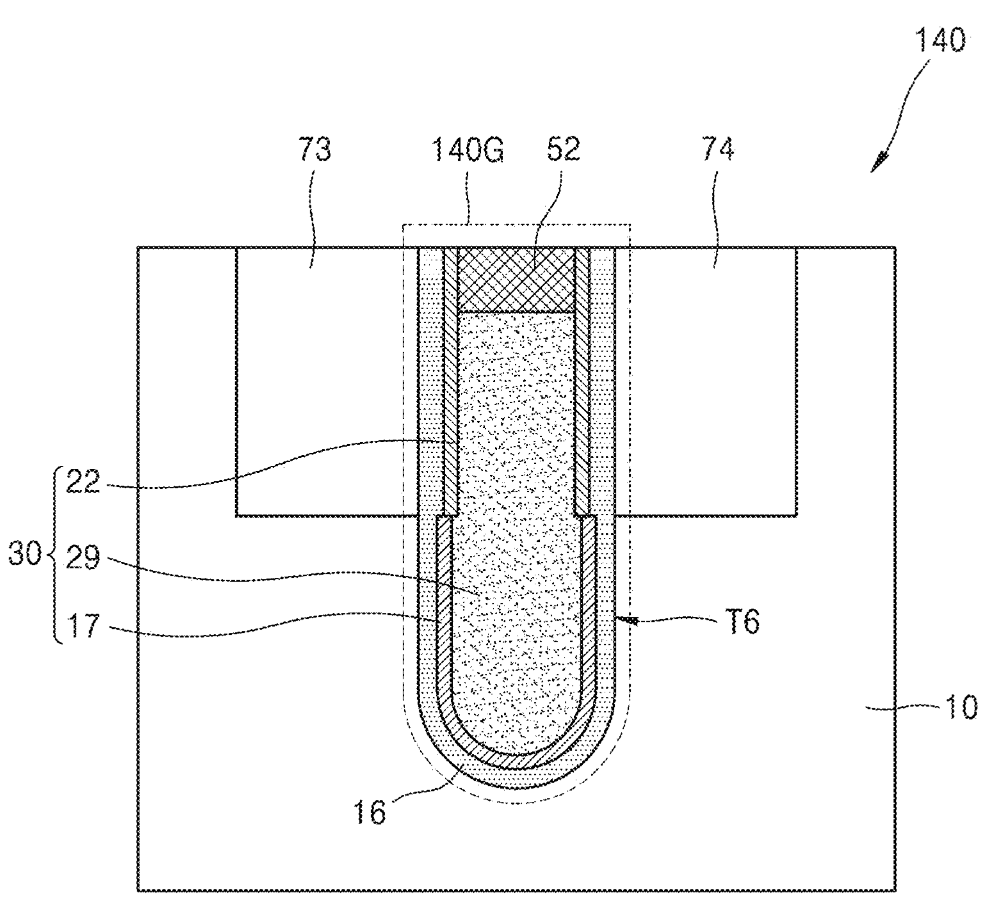
Figure 22:
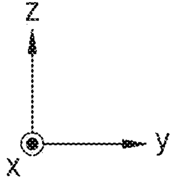

Referring to FIG. 22, a capping layer 52, which fills the capping layer trench T8, may be formed.

A semiconductor element 140 may be formed as shown in FIG. 22 by the semiconductor element fabricating method described with reference to FIGS. 8 and 17 to 22. The semiconductor element 140 may have a structure in which a gate structure 140G is provided in the trench T6. The semiconductor element 140 may be substantially the same as the semiconductor element 120 shown in FIG. 5.

Alternatively, operation S303 of the method of fabricating a semiconductor element according to FIGS. 17 to 22 may be modified to provide the semiconductor element 115 shown in FIG. 4B. For example, referring to FIGS. 4B, 20, 21, and 22, by forming the first conductive layer 32 and the second conductive layer 36' in the trench T6 instead of forming the conductive layer 29 in the trench T6 and then forming the capping layer 52 on the second conductive layer 36' in the trench T6, a semiconductor element like the semiconductor element 115 in FIG. 4B may be provided.

Figure 23:
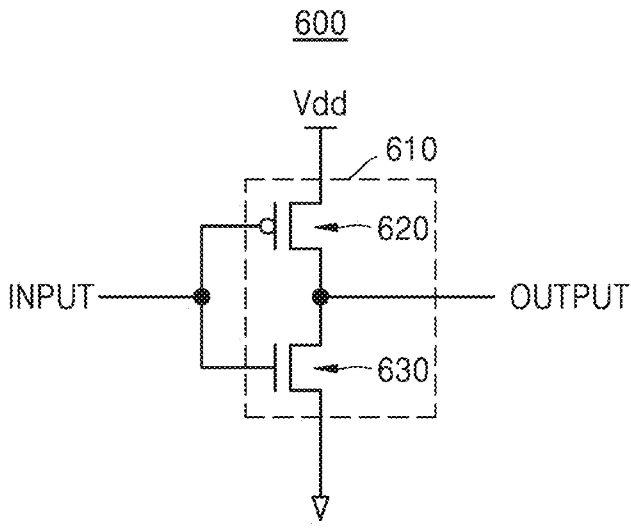
FIG. 23 is a circuit diagram illustrating a complementary metal oxide semiconductor (CMOS) inverter according to an embodiment.

FIG. 23 is a circuit diagram illustrating a complementary metal oxide semiconductor (CMOS) inverter 600 according to an embodiment.

The CMOS inverter 600 may include a CMOS transistor 610. The CMOS transistor 610 may include a p-channel metal oxide semiconductor (PMOS) transistor 620 and an n-channel metal oxide semiconductor (NMOS) transistor 630, which are connected between a power terminal Vdd and a ground terminal. The CMOS transistor 610 may include at least one of the semiconductor elements 100, 110, 115, and 120 which are described with reference to FIGS. 1 to 5 according to the various embodiments.

Figure 24:
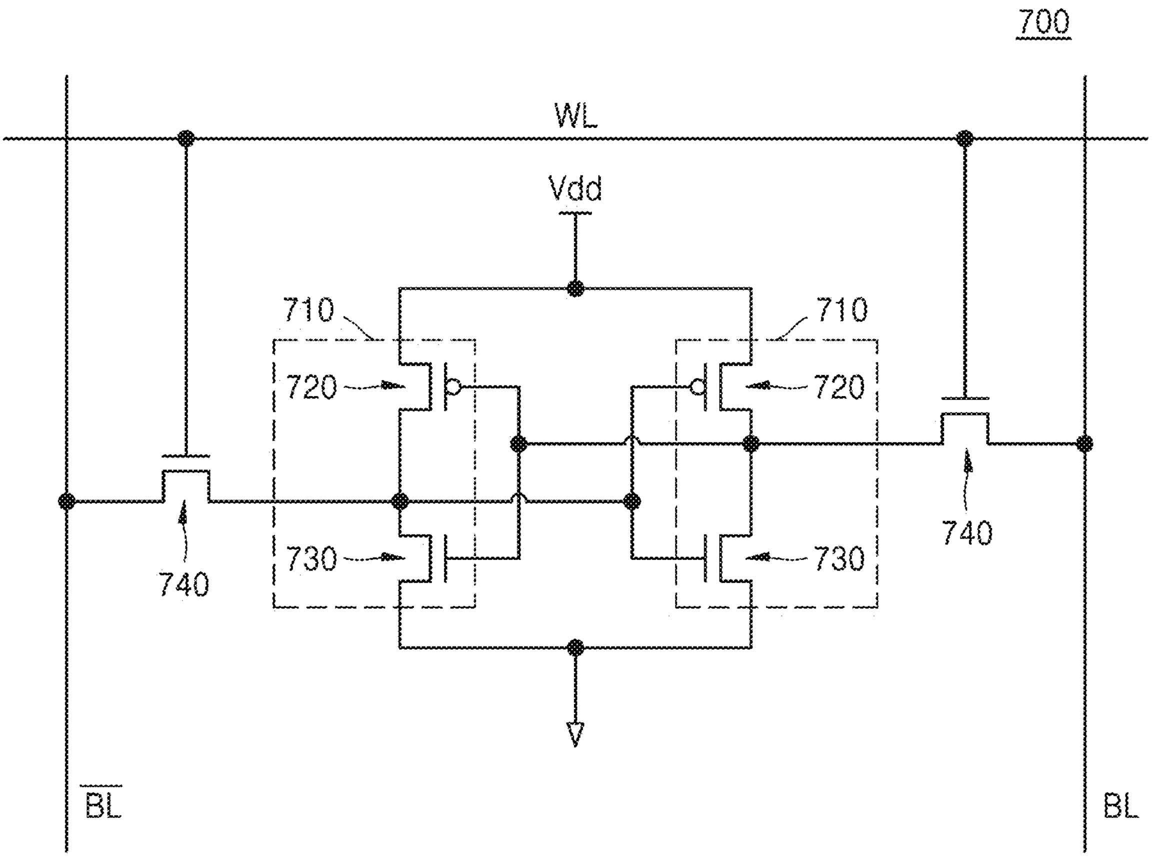
FIG. 24 is a circuit diagram illustrating a CMOS static random access memory (SRAM) device according to an example embodiment.

FIG. 24 is a circuit diagram illustrating a CMOS static random access memory (SRAM) device 700 according to an embodiment.

The CMOS SRAM device 700 may include a pair of driving transistors 710. Each of the pair of driving transistors 710 may include a PMOS transistor 720 and an NMOS transistor 730, which are connected between a power terminal Vdd and a ground terminal. The CMOS SRAM device 700 may further include a pair of transfer transistors 740. Sources of the pair of transfer transistors 740 are cross-connected to common nodes of the PMOS transistors 720 and the NMOS transistors 730 of the pair of driving transistors 710. The power terminal Vdd is connected to sources of the PMOS transistors 720, and the ground terminal is connected to sources of the NMOS transistor 730. A word line WL is connected to gates of the pair of transfer transistors 740, drains of the pair of transfer transistors 740 may be respectively connected to a bit line BL and an inverted bit line Cambria Math.

At least one of the pair of driving transistors 710 and the pair of transfer transistor 740 of the CMOS SRAM device 700 may include at least one of the semiconductor elements 100, 110, 115, and 120 which are described with reference to FIGS. 1 to 5 according to the various embodiments.

Figure 25:
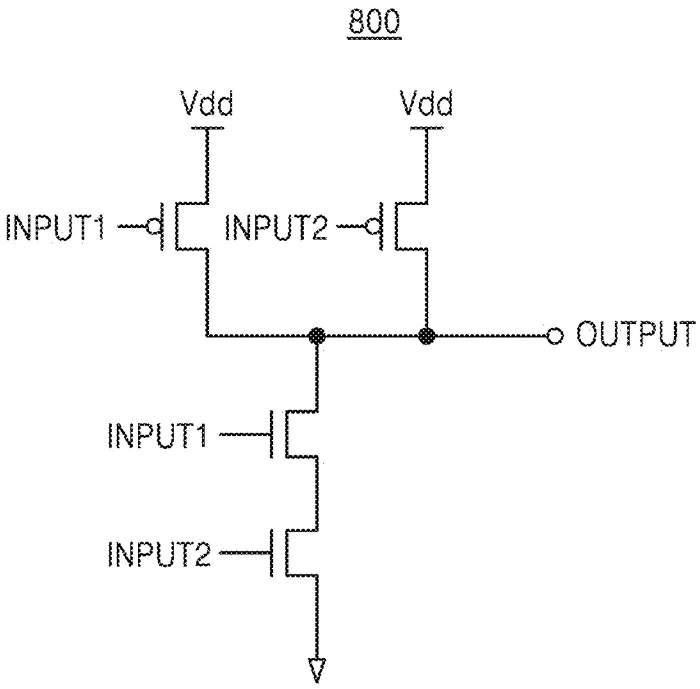
FIG. 25 is a circuit diagram illustrating a CMOS NAND circuit according to an embodiment.

FIG. 25 is a circuit diagram illustrating a CMOS NAND circuit 800 according to an embodiment.

The CMOS NAND circuit 800 may include a pair of CMOS transistors to which different input signals are transmitted. The CMOS NAND circuit 800 may include at least one of the semiconductor elements 100, 110, 115, and 120 which are described with reference to FIGS. 1 to 5 according to the various embodiments.

Figure 26:
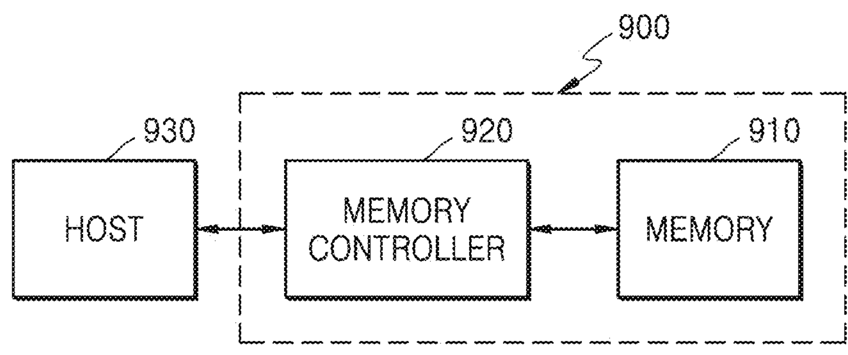
FIG. 26 is a block diagram illustrating an electronic system according to an embodiment.

FIG. 26 is a block diagram illustrating an electronic system 900 according to an embodiment.

The electronic system 900 may include a memory 910 and a memory controller 920. The memory controller 920 may control the memory 910 to read data from the memory 910 and/or write data to the memory 910 in response to a request from a host 930. At least one of the memory 910 and the memory controller 920 may include at least one of the semiconductor elements 100, 110, 115, and 120, which are described with reference to FIGS. 1 to 5 according to the various embodiments, and/or one of the semiconductor element array 200 or memory device 1000 described with reference to FIGS. 6 to 7 according to various embodiments.

Figure 27:
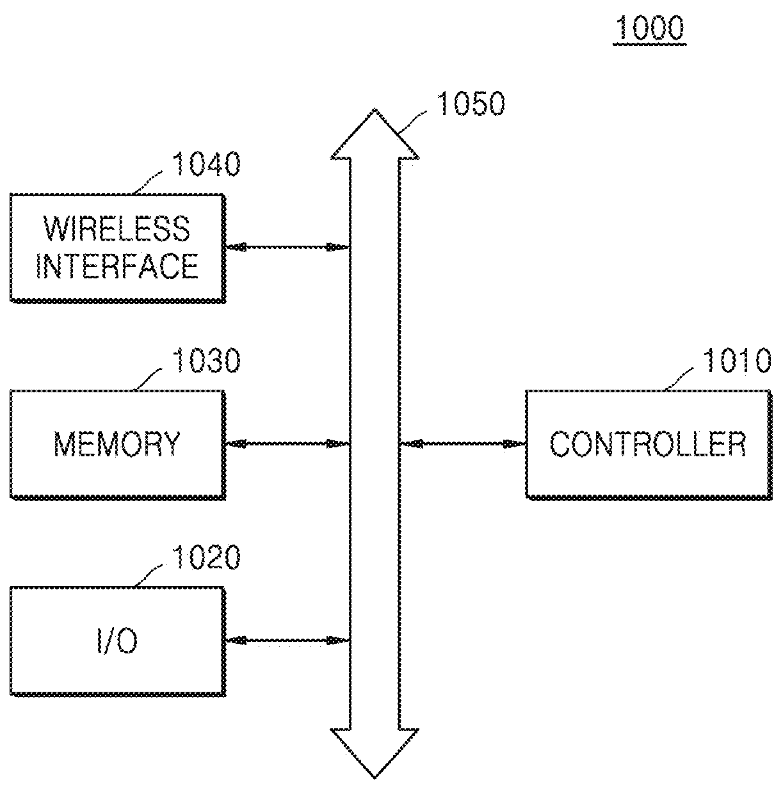
FIG. 27 is a block diagram illustrating an electronic system according to an embodiment.

FIG. 27 is a block diagram illustrating an electronic system 1000 according to an embodiment.

The electronic system 1000 may form a wireless communication device or a device capable of transmitting and/or receiving information in a wireless environment. The electronic system 1000 may include a controller 1010, an input/output device (I/O) 1020, a memory 1030, and a wireless interface 1040, which are connected to each other through a bus 1050.

The controller 1010 may include at least one selected from the group consisting of a microprocessor, a digital signal processor, and a processing device similar thereto. User's commands may be input through the I/O device 1020 for the controller 1010, and the I/O device 1020 may include at least one selected from the group consisting of a keypad, a keyboard, and a display. The memory 1030 may be used to store instructions executed by controller 1010. For example, the memory 1030 may be used to store user data. The electronic system 1000 may use the wireless interface 1040 to transmit/receive data through a wireless communication network. The wireless interface 1040 may include an antenna and/or a wireless transceiver. In some embodiments, the electronic system 1000 may be used for communication interface protocols (e.g., a third generation communication system such as code division multiple access (CDMA), global system for mobile communications (GSM), north American digital cellular (NADC), extended-time division multiple access (E-TDMA), and/or wide band code division multiple access (WCDMA), a fourth generation communication system such as 4G LTE, a fifth generation communication system and the like). The electronic system 1000 may include at least one of the semiconductor elements 100, 110, 115, and 120 which are described with reference to FIGS. 1 to 5 according to the various embodiments. For example, the memory 1030 may include at least one of the semiconductor elements 100, 110, 115, and 120 which are described with reference to FIGS. 1 to 5 according to the various embodiments and/or one of the semiconductor element array 200 or memory device 1000 described with reference to FIGS. 6 to 7 according to various embodiments.

As described above, various embodiments may provide a semiconductor element in which an upper region of a gate electrode adjacent to a source and a drain is provided with a two-dimensional material layer, an electronic system including the semiconductor element, and a method of fabricating the semiconductor element.

The one or more of the various embodiments may provide a semiconductor element fabricating method in which when a two-dimensional material is formed, hydrogen radicals may be supplied to lower the dielectric constant of a gate insulating layer adjacent to the two-dimensional material layer, or oxygen radicals may be supplied to increase the thickness of the gate insulating layer adjacent to the two-dimensional material layer, thereby reducing GIDL.

One or more of the elements disclosed above may include or be implemented in processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A semiconductor element comprising:

a substrate comprising a trench, a source region, and a drain region, the source region and the drain region separated apart from each other by the trench;

a gate insulating layer covering a bottom surface and a sidewall of the trench;

a gate electrode comprising a lower buried portion and an upper buried portion with the gate insulating layer therearound, the lower buried portion filling a lower region of the trench, and the upper buried portion being on the lower buried portion and filling an upper region of the trench; and a capping layer on the gate electrode, wherein the lower buried portion comprises a barrier layer and a first conductive layer, the barrier layer is in the trench, the barrier layer covers a bottom surface of the gate insulating layer and a lower region of a sidewall of the gate insulating layer, the barrier layer surrounds the first conductive layer, the first conductive layer fills the lower region of the trench, and the lower buried portion does not overlap the source region and the drain region, and wherein the upper buried portion comprises a two-dimensional material layer and a second conductive layer, the two-dimensional material layer is in the trench, the two-dimensional material layer covers an upper surface of the first conductive layer and an upper region of the sidewall of the gate insulating layer, the two-dimensional material layer surrounds the second conductive layer, the second conductive layer fills the upper region of the trench, and the upper buried portion overlaps the source region and the drain region, wherein a first dielectric constant of a lower region of the gate insulating layer is greater than a second dielectric constant of an upper region of the gate insulating layer.

2. The semiconductor element of claim 1, wherein a work function of the second conductive layer is less than a work function of the first conductive layer.

3. The semiconductor element of claim 1, wherein a work function of the second conductive layer is about 2 eV to about 5 eV.

4. The semiconductor element of claim 1, wherein the second conductive layer comprises at least one of aluminum (Al), titanium (Ti), chromium (Cr), gold (Au), nickel (Ni), and platinum (Pt).

5. The semiconductor element of claim 1,
wherein the two-dimensional material layer comprises at least one of graphene, black phosphorus, amorphous boron nitride, two-dimensional hexagonal boron nitride (h-BN), phosphorene, and a transition metal dichalcogenide.

6. A semiconductor element comprising:
a substrate comprising a trench, a source region, and a drain region,
the source region and the drain region separated apart from each other by the trench;
a gate insulating layer covering a bottom surface and a sidewall of the trench;
a gate electrode comprising a lower buried portion and an upper buried portion with the gate insulating layer therearound,
the lower buried portion filling a lower region of the trench, and
the upper buried portion being on the lower buried portion and filling an upper region of the trench; and
a capping layer on the gate electrode,
wherein the lower buried portion comprises a barrier layer and a first conductive layer,
the barrier layer is in the trench,
the barrier layer covers a bottom surface of the gate insulating layer and a lower region of a sidewall of the gate insulating layer,
the barrier layer surrounds the first conductive layer,
the first conductive layer fills the lower region of the trench, and
the lower buried portion does not overlap the source region and the drain region, and
wherein the upper buried portion comprises a two-dimensional material layer and a second conductive layer,
the two-dimensional material layer is in the trench,
the two-dimensional material layer covers an upper surface of the first conductive layer and an upper region of the sidewall of the gate insulating layer,
the two-dimensional material layer surrounds the second conductive layer,
the second conductive layer fills the upper region of the trench,
the upper buried portion overlaps the source region and the drain region, wherein the two-dimensional material layer directly contacts the gate insulating layer, and
wherein a first dielectric constant of a lower region of the gate insulating layer is greater than a second dielectric constant of an upper region of the gate insulating layer.

7. The semiconductor element of claim 1,
the lower region of the gate insulating layer surrounds the barrier layer, and
the upper region of the gate insulating layer surrounds the two-dimensional material layer.

8. The semiconductor element of claim 1,
wherein a material in the first conductive layer is different from a material in the second conductive layer.

9. An electronic system comprising:
a controller;
a memory configured to store instructions executed by the controller, the memory comprising the semiconductor element of claim 1; and
an input/output device coupled to the controller.

10. A semiconductor element comprising:
a substrate comprising a trench, a source region, and a drain region,
the source region and the drain region separated apart from each other by the trench;
a gate insulating layer covering a bottom surface and a sidewall of the trench;
a gate electrode comprising a barrier layer, a two-dimensional material layer, and a conductive layer; and
a capping layer on the gate electrode,
wherein the gate insulating layer surrounds the barrier layer,
the barrier layer is in the trench,
the barrier layer covers a bottom surface of the gate insulating layer and a lower region of a sidewall of the gate insulating layer,
the two-dimensional material layer covers an upper region of the sidewall of the gate insulating layer in the trench, and
the conductive layer is in the trench and includes a first conductive layer surrounded by the barrier layer and a second conductive layer surrounded by the two-dimensional material layer,
wherein the barrier layer does not overlap the source region and the drain region, and
the two-dimensional material layer overlaps the source region and the drain region,
a material in the first conductive layer is different from a material in the second conductive layer, and
wherein a first dielectric constant of a lower region of the gate insulating layer is greater than a second dielectric constant of an upper region of the gate insulating layer.

11. The semiconductor element of claim 10,
wherein the second conductive layer comprises at least one of aluminum (Al), titanium (Ti), chromium (Cr), gold (Au), nickel (Ni), and platinum (Pt).

12. The semiconductor element of claim 10,
wherein the two-dimensional material layer comprises at least one of graphene, black phosphorus, amorphous boron nitride, two-dimensional hexagonal boron nitride (h-BN), phosphorene, and a transition metal dichalcogenide.

13. The semiconductor element of claim 6,
wherein the two-dimensional material layer comprises at least one of graphene, black phosphorus, amorphous Boron Nitride, two-dimensional hexagonal boron nitride (h-BN), phosphorene, and a transition metal dichalcogenide.

14. The semiconductor element of claim 6,
wherein a first thickness of a lower region of the gate insulating layer is less than a second thickness of an upper region of the gate insulating layer,
the lower region of the gate insulating layer surrounds the barrier layer, and
the upper region of the gate insulating layer surrounds the two-dimensional material layer.

15. The semiconductor element of claim 1, wherein the two-dimensional material layer directly contacts the gate insulating layer.

16. The semiconductor element of claim 10, wherein the two-dimensional material layer directly contacts the gate insulating layer.

17. The semiconductor element of claim 6,
wherein a work function of the second conductive layer is less than a work function of the first conductive layer,
wherein the second conductive layer comprises at least one of aluminum (Al), titanium (Ti), chromium (Cr), gold (Au), nickel (Ni), and platinum (Pt).

18. The semiconductor element of claim 10, wherein
the lower region of the gate insulating layer surrounds the barrier layer, and the upper region of the gate insulating layer surrounds the two-dimensional material layer.

19. The semiconductor element of claim 6, wherein the lower region of the gate insulating layer surrounds the barrier layer, and the upper region of the gate insulating layer surrounds the two-dimensional material layer.

* * * * *